United States Patent
Park

(10) Patent No.: US 7,486,575 B2
(45) Date of Patent: Feb. 3, 2009

(54) SEMICONDUCTOR MEMORIES WITH BLOCK-DEDICATED PROGRAMMABLE LATENCY REGISTER

(75) Inventor: Chul Woo Park, Yongin-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 230 days.

(21) Appl. No.: 11/407,024

(22) Filed: Apr. 20, 2006

(65) Prior Publication Data

US 2007/0019481 A1 Jan. 25, 2007

(30) Foreign Application Priority Data

Jul. 19, 2005 (KR) .................. 10-2005-0065437

(51) Int. Cl.
*G11C 7/00* (2006.01)

(52) U.S. Cl. .................. 365/193; 365/194; 365/230.08

(58) Field of Classification Search ................ 365/233, 365/189.05, 230.03, 193, 194, 230.08
See application file for complete search history.

(56) References Cited

U.S. PATENT DOCUMENTS

| | | | |
|---|---|---|---|
| 6,031,787 A | 2/2000 | Jeddeloh | |
| 6,185,664 B1 | 2/2001 | Jeddeloh | |
| 6,385,709 B2 | 5/2002 | Merritt | |
| 6,646,928 B2 | 11/2003 | Bondurant | |
| 6,707,759 B2 * | 3/2004 | Song | 365/189.15 |
| 6,944,091 B2 * | 9/2005 | Lee et al. | 365/189.15 |
| 6,987,705 B2 * | 1/2006 | Kim et al. | 365/154 |
| 2002/0010831 A1 * | 1/2002 | DeMone et al. | 711/105 |

FOREIGN PATENT DOCUMENTS

| | | |
|---|---|---|
| JP | 07-326189 | 12/1995 |
| JP | 10-162572 | 6/1998 |
| KR | 2000-0044396 | 7/2000 |
| TW | 440869 | 6/2001 |
| TW | 454190 | 9/2001 |

OTHER PUBLICATIONS

Taiwan Office Action mailed Jul. 31, 2008 in TW095123995.

\* cited by examiner

*Primary Examiner*—Gene N. Auduong
(74) *Attorney, Agent, or Firm*—Stanzione & Kim, LLP

(57) ABSTRACT

An apparatus and method to delay output of data from different regions of a memory device in response to a read enable signal, the delaying of the output of data is based on the location of the regions of the memory device with respect to an output circuit that receives the data, wherein the different regions of the memory device have different CAS latency values dedicated to each region to set the delay time of each region of the memory device.

39 Claims, 25 Drawing Sheets

|  | Block 0 (CL_B0) | Block 1 (CL_B1) | Block 2 (CL_B2) | Block 3 (CL_B3) |
|---|---|---|---|---|
| 1 mode | 7 | 8 | 9 | 10 |
| 2 mode | 7 | 8 | 10 | 10 |
| 3 mode | 7 | 10 | 10 | 10 |
| 4 mode | 10 | 10 | 10 | 10 |
| 5 mode | 7 | 9 | 9 | 10 |
| 6 mode | 9 | 9 | 9 | 10 |
| 7 mode | 8 | 8 | 9 | 10 |
| 8 mode | 8 | 8 | 10 | 10 |

FIG. 13B

|  | Block address 1 (BA1=CA9) | Block address 2 (BA0=CA8) |
|---|---|---|
| block 3 | 1 | 1 |
| block 2 | 1 | 0 |
| block 1 | 0 | 1 |
| block 0 | 0 | 0 |

FIG. 15B

| block | 1 | 2 | 3 | | 4 | |
|---|---|---|---|---|---|---|
| BA0 | X | X | 0 | 1 | 0 | 1 |
| BA1 | 1 | 1 | 0 | 0 | 0 | 0 |
| RAMSB | X | X | 0 | X | 1 | X |
| CAMSB | 0 | 1 | X | X | X | X |

X : don't care

FIG. 18B

SEMICONDUCTOR MEMORIES WITH BLOCK-DEDICATED PROGRAMMABLE LATENCY REGISTER

CROSS-REFERENCE TO RELATED APPLICATIONS

This application claims the benefit of Korean Patent Application No.10-2005-65437 filed on Jul. 19, 2005, in the Korean Intellectual Property Office, the disclosure of which is incorporated herein in its entirety by reference.

BACKGROUND OF THE INVENTION

1. Field of the Invention

The present general inventive concept relates to semiconductor memory devices, and more particularly, to synchronous memory devices having a block-dedicated programmable latency register.

2. Description of the Related Art

FIG. 1 is a timing diagram illustrating a read operation of a semiconductor memory device (SDRAM). In FIG. 1, CLK refers to a clock signal, COMMAND in this example refers to a read command, ADDRESS refers to a signal providing instructions to access a column address, and DATA OUTPUT illustrates the output of the memory device at any particular time. Latency generally refers to the time between the start and the completion of an event. In synchronous DRAMs, latency is usually counted by the number of clocks taken for a particular even. As illustrated in FIG. 1, CAS (column address strobe) Latency refers to the time between the start and the completion of a read operation in a column address of a memory space within an SDRAM, or the latency by the number of clocks from the READ command (together with the Column Address command) to the first data output. Stated differently, CAS Latency refers to a parameter used by the SDRAM to synchronize the output data obtained as a result of a READ request (command) with a particular edge of the system clock (CLK). The "Burst Length" refers to the number of consecutive output data as a result of a READ command (in FIG. 1 the Burst Length=4). As illustrated in FIG. 1, when the READ command and the Column Address command are provided, the consecutive number of clocks before the start of the data output is the CAS Latency, which in this example is a CAS Latency=3.

FIG. 2 illustrates an intrinsic speed parameter of a DRAM data path, or a number of required operations for the data access time of a DRAM from when a column ADDRESS command is entered. As illustrated in FIG. 2, $t_{AA}$ is the intrinsic speed parameter of a DRAM data path, which limits fundamentally the number of CL required to obtain proper data output as a result of the READ command (the data access time by the number of clocks). Thus, CL cannot exceed the value of $t_{AA}$ ($t_{AA} < CL \times t_{CK}$). For example, if $t_{CK}$ and $t_{AA}$ is 5 ns (200 Mhz) and 15 ns respectively, the minimum value of CL is 4. With a $t_{AA}$ of 15 ns and $t_{CK}$ of 2.5 ns (400 Mhz), the minimum CL is 7. Since the column address request occurs at the column select line (CSL), the value of $t_{AA}$ depends on the distance from the CSL to the $D_{out}$ Driver.

The CL value is commonly programmed using a Mode Register Set (MRS) command. A mode register is used to define the specific mode of operation of an SDRAM. In other words, the mode register stores the data for controlling the various operation modes of DDR SDRAM. FIG. 3 illustrates a mode register and the mode register set (MRS). The mode register programs CAS Latency, addressing mode, burst length, test mode, DLL reset and various vendor specific options to make DDR SDRAM useful for a variety of different applications. The default value of the mode register is not defined, and therefore the mode register must be written after an external mode register set (EMRS) setting for proper DDR SDRAM operation.

The mode register is written by asserting low on CS, RAS. CAS. WE and BA0 (the DDR SDRAM should be in all bank precharge with CKE already high prior to writing into the mode register). The states of address pins A0-A11 (A12) in the same cycle as CS, RAS, CAS, WE and BA0 going low are written in the mode register. Two clock cycles are requested to complete the write operation in the mode register. The mode register contents can be changed using the same command and clock cycle requirements during operation as long as all banks are in the idle state. The mode register is divided into various fields depending on functionality. The burst length uses A0-A2, and the addressing mode uses A3, CAS latency (read latency from column address) uses A4-A6. A7 is used for test mode and A8 is used for DLL reset. A7 must be set to low for normal MRS operation. The CAS Latency table illustrates to specific codes for various burst lengths, addressing modes and CAS latencies.

As described above and illustrated in FIG. 3, it is clear that CL is commonly programmed using an MRS command. FIG. 4 illustrates how the MRS command is used to set a CL value to 2, for example, when A4 is set to logic 0, A5 is set to logic 1, and A6 is set to logic 0 (see table FIG. 3). As a result, the CL (CAS Latency) is programmed to be a value of 2 by the mode register.

FIG. 5A illustrates a memory device of a conventional SDRAM device, and how it is divided into Banks, i.e., Bank A, Bank B, Bank C and Bank D. In turn, each of the Banks is divided into a plurality of memory blocks (i.e., block 0-block n), as illustrated in FIG. 5B. Moreover, each of the memory blocks can include a plurality of memory cells. Each of the blocks within a bank can be accessed by row and column addresses, provided as logic codes. For example, FIG. 6A illustrates a bank of a memory device, which is divided into many memory blocks. The memory blocks in the bank illustrated in FIG. 6A can be selected to be accessed for reading the data stored therein by activating a part of row addresses and column addresses using binary logic, as illustrated in FIGS. 6B and 6C.

In view of the above discussion of operations of an SDRAM, a conventional synchronous memory device and its operations will be discussed below.

Conventional synchronous memory devices are allowed to have only one CAS latency (CL) value, which is programmed using an MRS command, as described supra. In other words, the first one of the burst read data is designed to be output in the same number of clocks when the READ command is entered, regardless of the spatial distance of the designated memory block (or cell) from a data output circuitry block including data output buffers, which receives the data being read. The data being read is commonly chosen to be read by the appropriate column and row address provided by the ADDRESS with read command (see FIG. 1). The burst data is output to the data output circuitry block including the data output buffers. However, the data path to the data output circuitry block from the cells in a near-side block (i.e., a closest block to the output circuitry block) can be expected to have a shorter access time than a far-side block (i.e., a farthest block from the output circuitry block). FIG. 7 illustrates a memory bank including a plurality of blocks (Blocks 0-n), and how the blocks are decoded with respect to a row decoder and a column decoder. As illustrated in FIG. 7, block_0 is a near-side block with respect to output circuits and pads (i.e., the output circuitry block), while block_n is a far-side block with respect to the output circuits and pads. The difference in this distance can be represented by the following equation: $\Delta t_{AA} = t_{AA\,far} - t_{AA\,near}$, where $\Delta t_{AA}$ is the difference of $t_{AA}$ (data access time) between near-side and far-side memory blocks.

If only one CL value is permitted to be used, as is the case in conventional synchronous memory devices, the $t_{AA}$ of the memory device is decided by the data access time of the farthest block of the memory device (i.e., the far-side block). In other words, since the CL value refers to the time it takes between the start and the completion of a read operation in an SDRAM (see FIG. 1), the CL value must be set in consideration of the longest data access time (data received from the far-side block). Thus, if only one value of CL is permitted for a memory device, as in conventional SDRAMs, the data of the near-side block often must wait for a period of time longer than necessary to be accessed, although this data is in fact ready to be accessed at an earlier time than that of the far-side block. In addition to the above stated drawbacks of the conventional SDRAMs, some additional drawbacks that result using conventional SDRAMs are listed below.

As market demand increases for faster memory devices with larger memory density, it is with certainty that memory sizes will continue to become larger while the operating clock cycle time $t_{CK}$ will continue to be reduced. As the memory sizes become larger, the difference between the far-side and near-side block ($\Delta t_{AA}$) will also become larger, and $\Delta t_{AA}$ will become larger than the clock cycle time $t_{CK}$. As a result, as memory devices continue to grow while continuing to have only one CL value, it is certain that total memory performance of the memory devises will experience critical losses. For example, as $t_{CK}$ becomes smaller and smaller, the $\Delta t_{AA}$ will become larger than one $t_{CK}$, and if memories have only one CL while their determination of CL value continues to be based on the access time from a far-side block, the data from a near-side block will have to be delayed by more than one $t_{CK}$ to meet the CL requirement.

SUMMARY OF THE INVENTION

Accordingly, there is a need for memory blocks having different CL values according to the location of each memory block from data output circuits including a data output buffer.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept are achieved by providing a semiconductor memory device, comprising: at least one memory bank having a plurality of memory blocks to store data, the data stored in the memory blocks capable of being read in response to a read command; a control unit to generate a plurality of CL values and to dedicate the CL values to predetermined ones of the memory blocks to be read; and an output circuit to output the data in response to a read signal activated by the read command, wherein the output circuit outputs the data from each of the memory blocks based on the dedicated CL values.

In the semiconductor memory device, the control unit may include: a CL register including a plurality of sets of mode registers, each of the sets of mode registers to generate the plurality of CL values; and a CL Mux unit to select one of the plurality of CL values from each set of mode registers responsive to a column address within the read command and to dedicate the selected CL values to the predetermined ones of the memory blocks based on predetermined conditions of the memory blocks.

In the semiconductor memory device, the predetermined conditions of the memory blocks may include a location of the memory blocks with respect to the output circuit in which the data is outputted.

The foregoing and/or other aspects and utilities of the present general inventive concept are also achieved by providing a latency control unit usable with a memory device having a plurality of memory blocks to store data, comprising: a CL register including at least one set of mode registers, each set of mode registers to generate one or more CAS latency values and being dedicated to one of the memory blocks; a CL Mux to receive the generated CAS latency values from the at least one set of mode registers and to select one of the received CAS latency values based on a signal containing information on the memory blocks to be read; and an output enable circuit to receive the selected CAS latency value and a read enable signal activated by a read command and to output an output enable signal to an output circuit.

In the latency control unit, the output circuit can output the data stored in accessed memory blocks according to the read command based on the selected CAS latency value and the output enable signal.

The foregoing and/or other aspects and utilities of the present general inventive concept are also achieved by providing a latency control unit usable with a memory device having a plurality of memory blocks to store data and a data output circuit to enable output of the stored data from the memory blocks in accordance with a read enable signal, the latency control unit comprising: a latency determining unit to determine a plurality of latency values, and to select predetermined ones of the latency values based on an address signal indicating locations of the memory blocks to be read; and an output enable unit to receive the latency values output from the latency determining unit and to apply the latency values to the data output circuit to delay output of data from the plurality of memory blocks, wherein the data is output according to predetermined ones of the plurality of latency values based on the location of the memory block in which the data is being output.

The foregoing and/or other aspects and utilities of the present general inventive concept are also achieved by providing a memory device comprising: at least one memory bank including a plurality of memory blocks; an address buffer to receive an address signal, to output MRS addresses to set a CL mode when an MRS command is input, and to output addresses of the address signal when a read command is input; an address decoder to decode the addresses and select one of the memory blocks having block addresses; a command decoder to receive the MRS command and output a pMRS signal, and to receive the read command and to output a read enable signal; and a CAS latency control unit to receive the MRS addresses and the pMRS signal when the MRS command is input so that the CL mode having a plurality of CL values is set, to receive the block addresses to activate one of the plurality of CL values and the read enable signal, and to output an output enable signal to an output circuit according to the activated CL value, wherein the output circuit outputs read data from the selected memory block responsive to the output enable signal.

In the memory device, the CAS latency control unit may comprise: a CL register including a plurality of mode registers each generating predetermined CL values based on the MRS addresses when the pMRS signal is activated; a CL Mux unit to activate one of the CL values from each of the mode registers according to the block addresses; and an output enable circuit to receive the read enable signal and the activated CL value, to delay the read enable signal by a number of clocks indicating the activated CL value, and to output the delayed read enable signal as the output enable signal.

The foregoing and/or other aspects and utilities of the present general inventive concept are also achieved by providing a memory device comprising: an output circuit; a plurality of memory blocks that are different distances from the output circuit; and a CAS latency control part to operate the output circuit in a plurality of modes including at least a first mode in which the output circuit is operated with a CAS latency value that is the same for accessing the plurality of memory blocks and a second mode in which the output circuit is operated with CAS latency values that are different for accessing the plurality of memory blocks.

The memory device may comprise a synchronous dynamic random access memory having an outer DQ inner clock (ODIC) architecture.

In the memory device, the plurality of blocks may comprise a plurality of memory banks.

In the memory device, the plurality of blocks may further comprise a plurality of regions within the plurality of memory banks.

In the memory device, the CAS latency control part may be programmable between the plurality of modes using two or more bits of a mode register set (MRS) command.

In the memory device, the CAS latency control part can receive a memory address of one of the plurality of memory blocks to be accessed from a read command, and can select among the different CAS latency values according to the received memory address when the output circuit is operated in the second mode.

In the memory device, the CAS latency control part may comprise: a plurality of registers corresponding to the plurality of memory blocks to store the respective CAS latency values; and a multiplexer to select from among the plurality of respective CAS latency values according to whether the CAS latency control part operates in the first mode or the second mode.

In the memory device, the multiplexer can receive an address of a current memory block being accessed and can select a CAS latency value according to the received address.

In the memory device, the CAS latency control part may further comprise: an output enable circuit to receive the selected CAS latency value and a read enable signal associated with a read command and to delay the read enable signal by a number of clock cycles that corresponds to the selected CAS latency value and to apply an output enable signal that corresponds to the delayed read enable signal to the output circuit.

In the memory device, the received address may comprise at least one of a bank address, a column address, and a row address.

In the memory device, the plurality of memory blocks may comprise: four memory banks disposed in each corner of a memory chip on which the memory device is implemented such that the output circuit is disposed on one side of the memory chip in between two memory banks; and four memory regions arranged among the four memory banks such that each of the four memory regions is a different distance from the output circuit.

In the memory device, each of the memory regions can extend over more than one of the memory banks.

In the memory device, the first ones of the memory regions can extend along a row direction of the memory banks, and second ones of the memory regions can extend along a column direction of the memory banks.

In the memory device, the plurality of registers may comprise a plurality of mode registers that are programmable by a series of bits of an MRS command received along an address bus; and the multiplexer may comprise a plurality of logic units to output a logic high value on an output that corresponds to the selected CAS latency value.

In the memory device, the plurality of registers can store the plurality of CAS latency values that corresponds to the plurality of memory blocks.

In the memory device, the plurality of different CAS latency values can correspond to different data access times of the plurality of memory blocks.

The foregoing and/or other aspects and utilities of the present general inventive concept are also achieved by providing a memory device comprising: a plurality of memory units; and a control part to receive a current address associated with a read command, to select a CAS latency value on the fly from among a plurality of CAS latency values associated with the plurality of memory units according to the current address, and to apply the selected CAS latency value to an output circuit of the memory device.

In the memory device, the plurality of memory units may comprise: a far memory unit having a long data access time and a corresponding CAS latency value; and one or more near memory units having shorter access times and CAS latency values that are programmable to be less than or equal to the CAS latency value of the far memory unit.

The foregoing and/or other aspects and utilities of the present general inventive concept are also achieved by providing a method of accessing data from a semiconductor memory device including a plurality of memory blocks, the method comprising: setting a CL mode having a plurality of CL values to correspond to the plurality of memory blocks when an MRS command is input; receiving an address to indicate which block is read when a read command is input; selecting one of the plurality of CL values indicated by the received address; delaying a read enable signal associated with the read command by a number of clocks designated by the selected CL value and outputting an output enable signal to an output circuit according to the delayed read enable signal; and outputting data read from the block indicated by the address based on the output enable signal.

The foregoing and/or other aspects and utilities of the present general inventive concept are also achieved by providing a method of accessing data from a semiconductor memory device including a plurality of memory banks each having a plurality of memory blocks therein to store data, the method comprising: dedicating a plurality of CL values to be used by an output circuit that enables data stored in the plurality of memory blocks to be output according to the corresponding plurality of CL values; receiving an address of a selected memory block to be read associated with a read command; and providing an enable signal that is delayed according to the CL value of the addressed memory block to the output circuit; and outputting the data read from the addressed memory block according to when the delayed enable signal is received.

In the method of accessing data from a semiconductor memory device, the dedicating of the plurality of CL values to be used by an output circuit may comprise dedicating different CL values to memory blocks having different distances from the output circuit.

In the method of accessing data from a semiconductor memory device, the CL values can be dedicated to predetermined addresses of the memory blocks such that smaller CL values are applied to memory blocks which are closer to the output circuit and increasingly larger CL values are applied to memory blocks which are positioned increasingly farther away from the output circuit, such that a delay in outputting the data stored in the addressed memory blocks proportionally increases as a distance of the memory block from the output circuit increases.

The foregoing and/or other aspects and utilities of the present general inventive concept are also achieved by providing a method of reading data from a memory device having a at least two memory blocks, comprising: providing an address signal containing information pointing to at least two addresses of the memory device to be read; selecting at least two CL values that delay for predetermined periods of time outputting of the data to be read from the memory device based on the address signal information; and enabling output of the data to be read from the at least two addresses of the memory device at different delayed periods of time based on the CL value selected for the corresponding address upon receiving a read enable signal instructing the data to be read from the at least two addresses of the memory device.

In the method of reading data from a memory device having a at least two memory blocks, the address signal information may include information about the locations of the addresses of the memory blocks to be read.

The foregoing and/or other aspects and utilities of the present general inventive concept are also achieved by providing a method of reading data from a memory device having a I/O pad and a plurality of memory blocks that are different distances from the I/O pad, the method comprising: applying different CAS latency values to the plurality of memory blocks on the fly when a read command is input.

The foregoing and/or other aspects and utilities of the present general inventive concept are also achieved by providing a method of managing data read commands in a memory device, the method comprising: selecting different column address strobe (CAS) latency values to correspond to memory blocks having different data access times; and delaying a read enable signal associated with each of the memory blocks according to the different CAS latency values when the different memory blocks are accessed.

In the method of managing data read commands in a memory device, the selecting of the different CAS latency values may comprise enabling a CAS latency mode having the different CAS latency values for each memory block to be set by an MRS command.

In the method of managing data read commands in a memory device, the delaying of the read enable signal may comprise: receiving a read command having an address to read a specified memory block; and selecting the CAS latency value that corresponds to the specified memory block according to the received address.

In the method of managing data read commands in a memory device, the delaying of the read enable signal may comprise: delaying the read enable associated with a specified memory block by a number of clock cycles of the corresponding CAS latency value; and providing an output enable signal to enable an output circuit having read data from the specified memory block according to the delayed read enable signal associated therewith.

In the method of managing data read commands in a memory device, the selecting of the different CAS latency values may comprise selecting a first CAS latency value for a near memory block and selecting a second CAS latency value for a far memory block through an MRS command, and the far memory block is the farthest memory block from an output circuit and the near memory block is closer to the output circuit than the far memory block.

In the method of managing data read commands in a memory device, the selecting of the first CAS latency value may comprise: setting the first CAS latency value to be less than the second CAS latency value in a first mode of operation; and setting the first CAS latency value to be equal to the second CAS latency value in a second mode of operation.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIG. 13B illustrates a Table of CL values to be used for respective blocks of the memory address of FIG. 12, depending on the mode in which the blocks are being accessed;

FIG. 15B illustrates a truth table that corresponds to the CL address decoder of FIG. 15A;

FIG. 18B illustrates a table of logic values that identify the location of addresses for the regions of the banks of FIG. 18A;

DETAILED DESCRIPTION OF THE PREFERRED EMBODIMENTS

Figure 1:
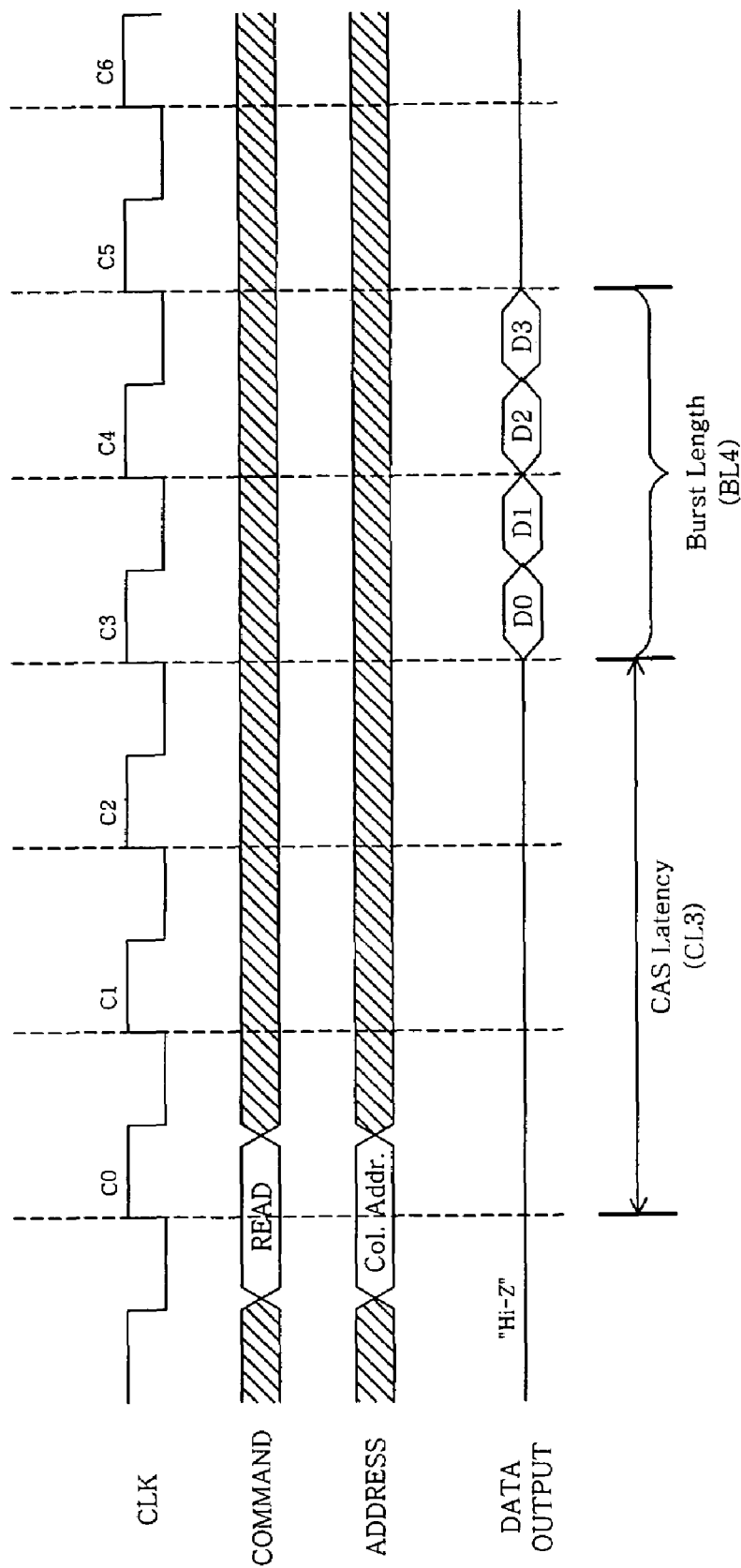
FIG. 1 is a timing diagram illustrating a read operation of a semiconductor memory device (SDRAM)
Figure 2:
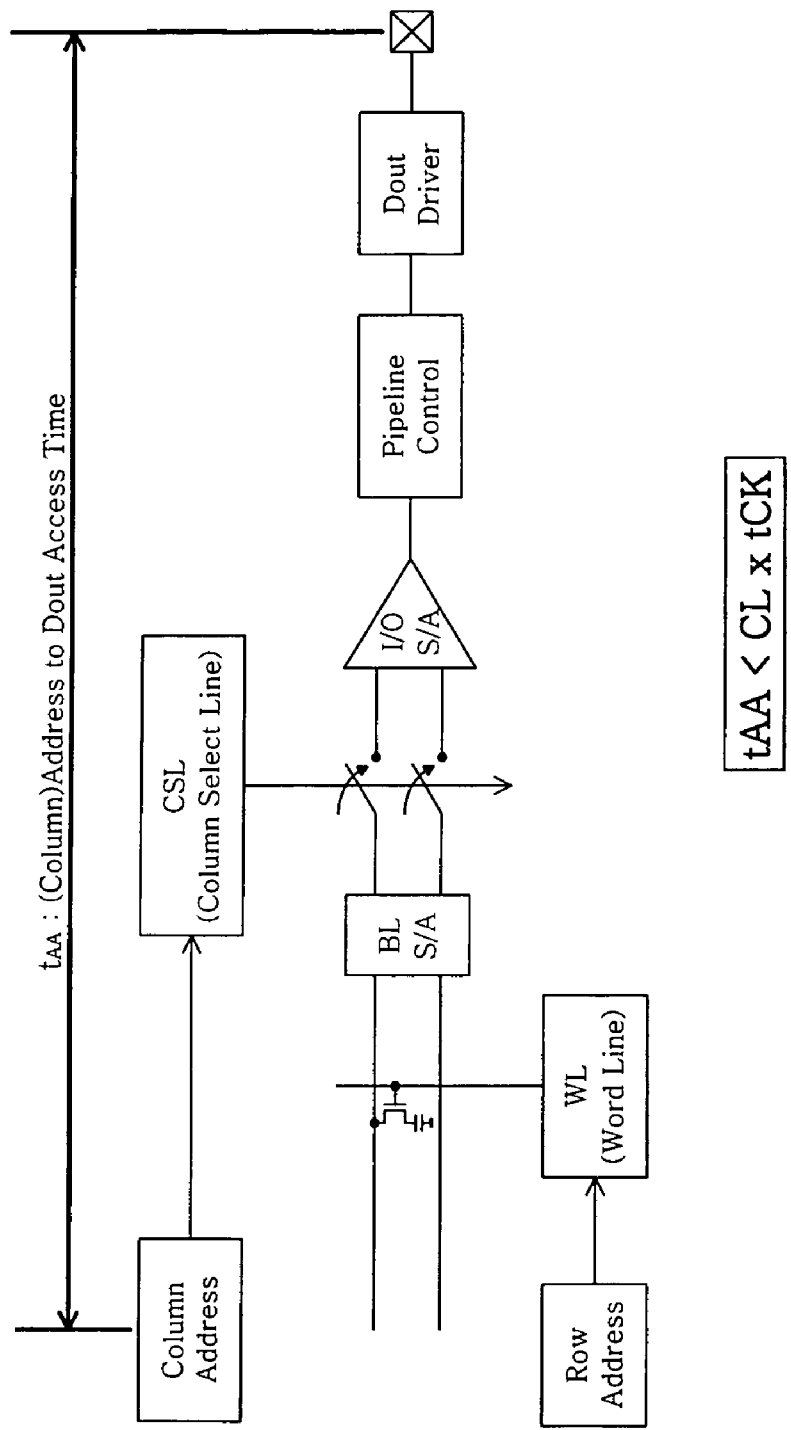
FIG. 2 illustrates an intrinsic speed parameter of a DRAM data path.
Figure 3:
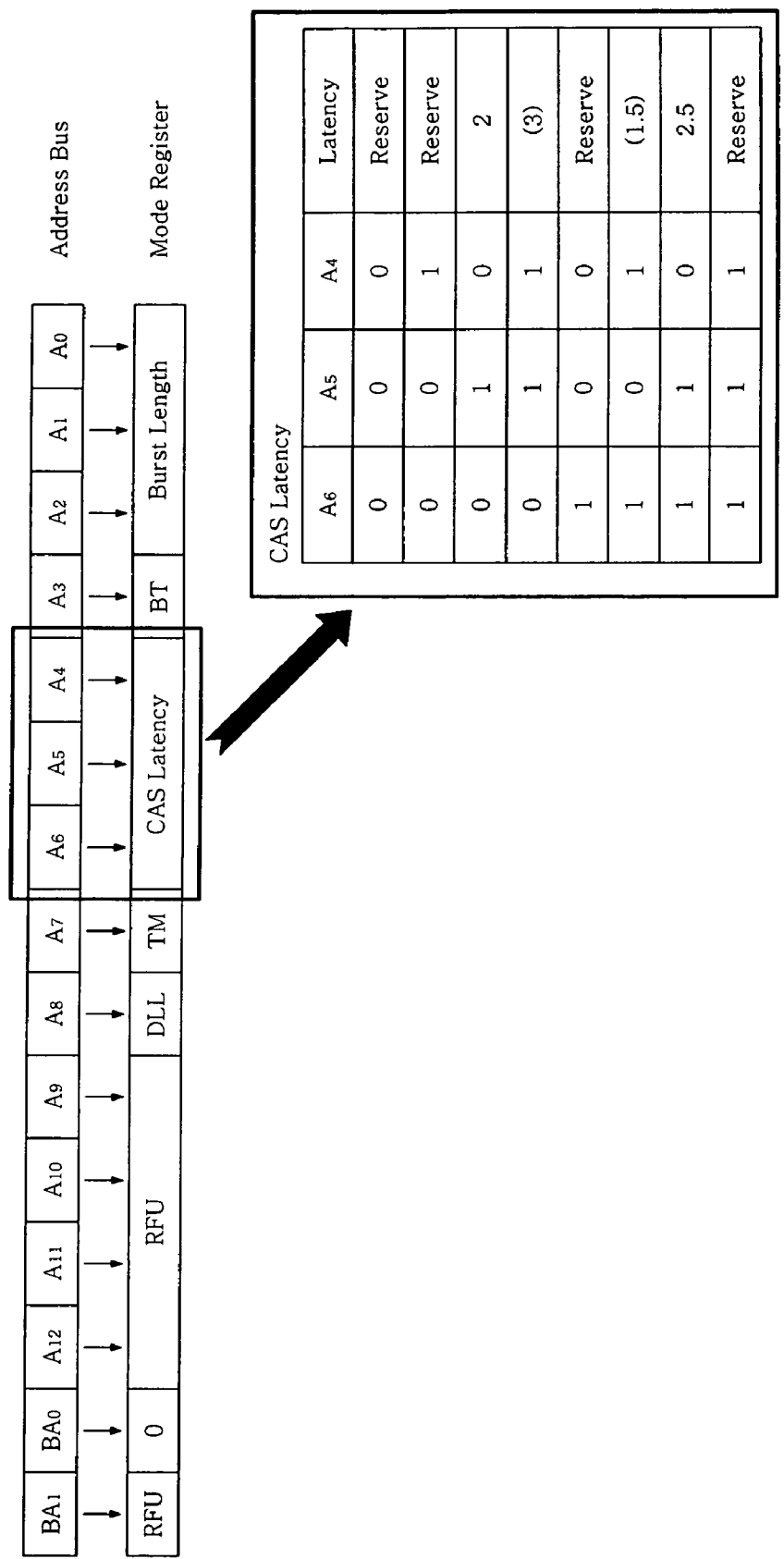
FIG. 3 illustrates a mode register of a DDR SDRAM and the mode register set (MRS)
Figure 4:
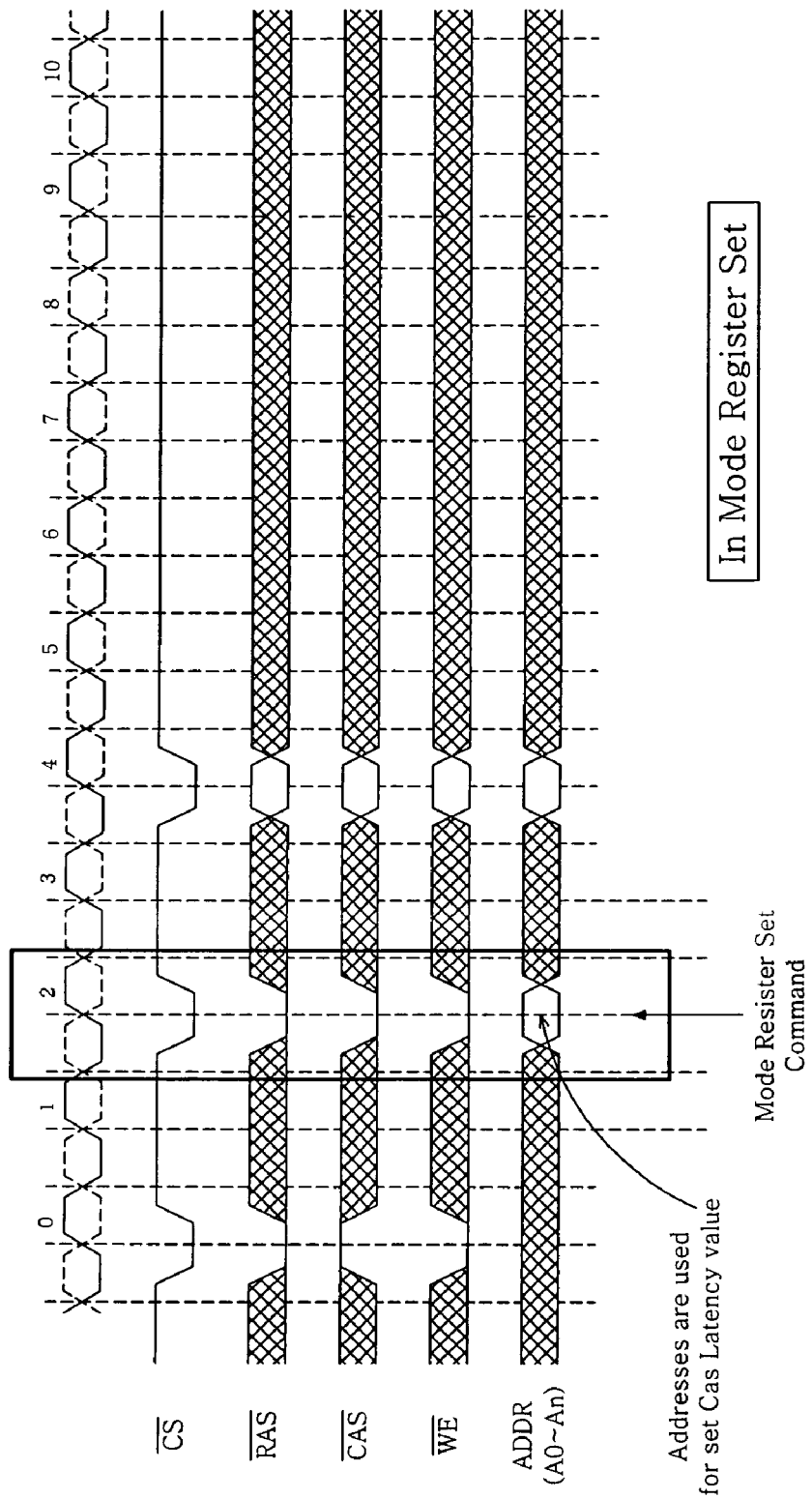
FIG. 4 illustrates how the MRS command is to set a CL.
Figure 5:
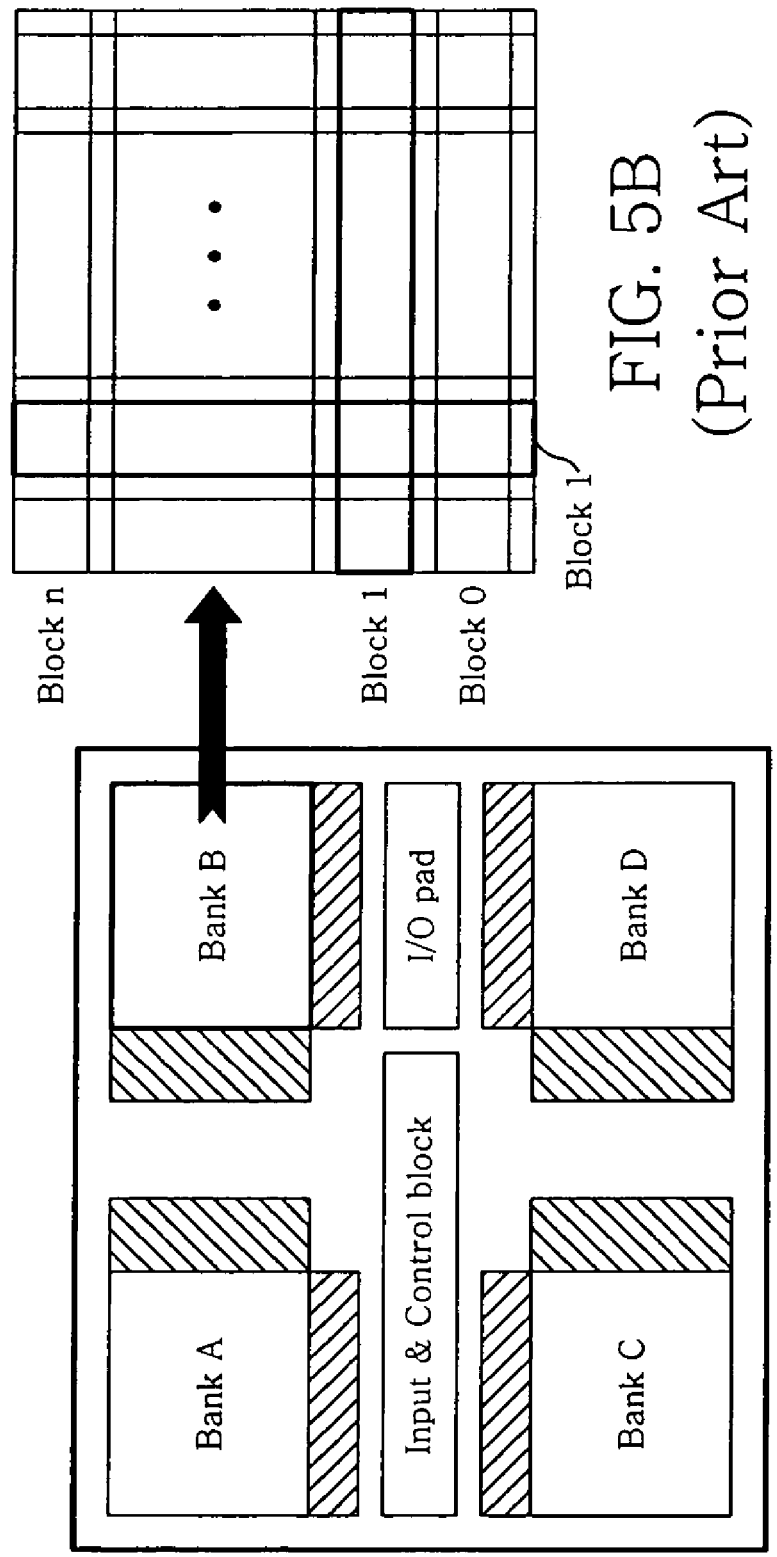
FIG. 5A illustrates a memory array of a conventional SDRAM device.
FIG. 5B illustrates a plurality of memory blocks of the conventional SDRAM device of FIG. 5A.
Figure 6:
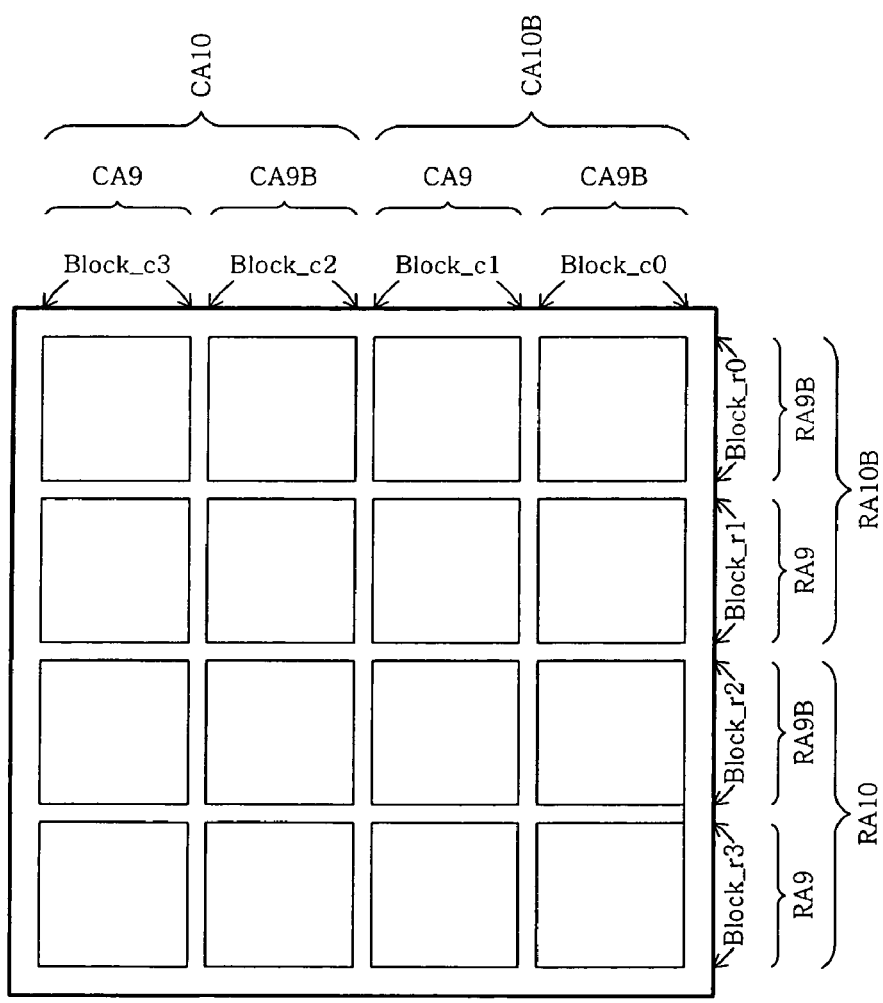
FIG. 6A illustrates a Bank of a conventional memory array, divided into columns and rows.
FIGS. 6B-6C illustrate tables including codes for accessing row addresses and column addresses of the Bank of a conventional memory array of FIG. 6A.
Figure 7:
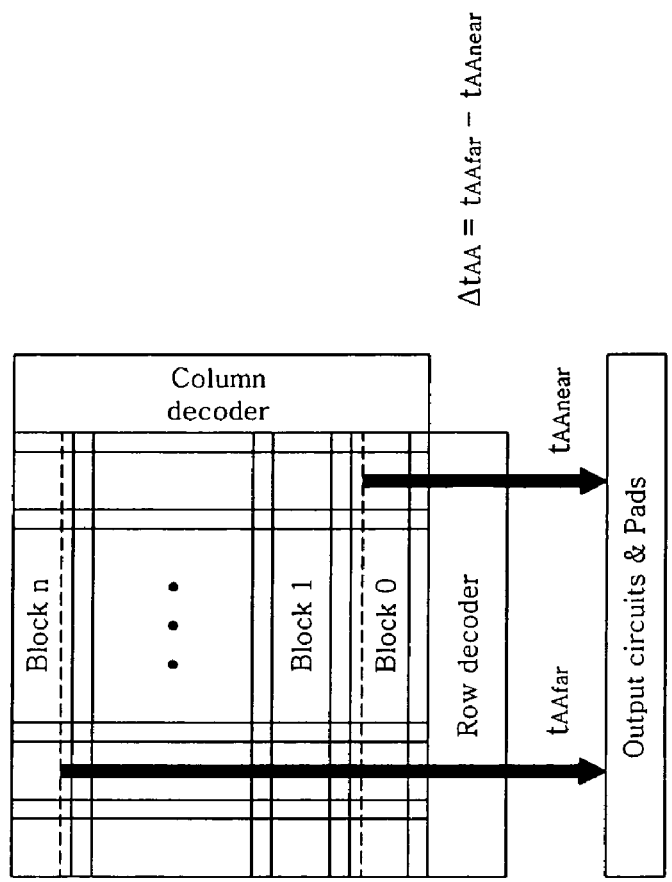
FIG. 7 illustrates a conventional memory cell array including a plurality of blocks 0-n, and how the blocks are decoded using a row decoder and a column decoder.

Reference will now be made in detail to the embodiments of the present general inventive concept, examples of which are illustrated in the accompanying drawings, wherein like reference numerals refer to the like elements throughout. The various embodiments are described below in order to explain the present general inventive concept while referring to the figures.

Figure 8:
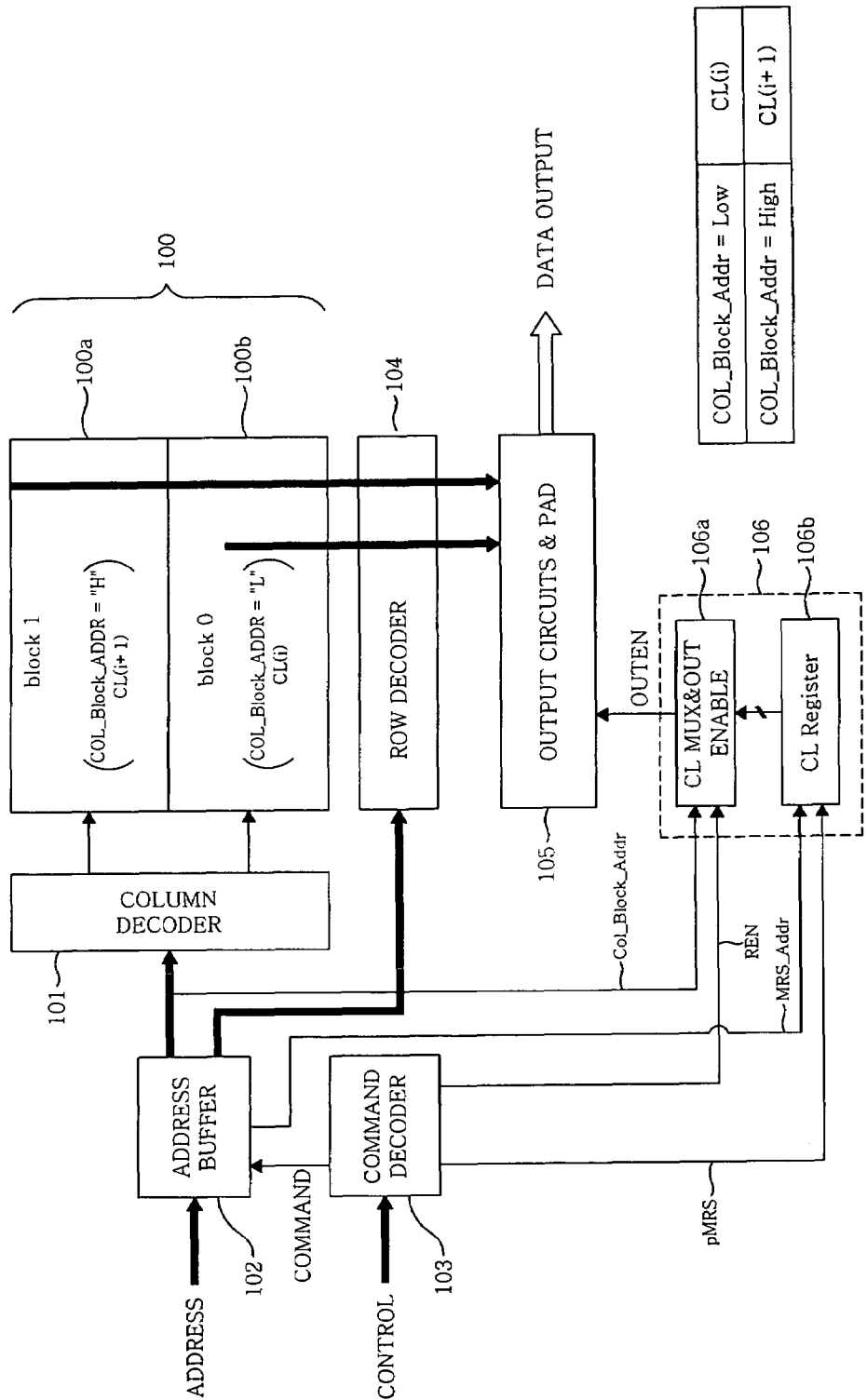
FIG. 8 illustrates a block diagram of a synchronous memory device according to an embodiment of the present general inventive concept.

FIG. 8 illustrates a block diagram of a synchronous memory device according to an embodiment of the present general inventive concept. Referring to FIG. 8, a memory bank 100 includes a memory block_0 100b (i.e., a near memory block) and a memory block_1 100a (i.e., a far memory block). A column decoder 101 and a row decoder 104 are used to access specific portions of a block within the bank 100 using logic codes. An address buffer 102 receives signals that are addresses of a block to be accessed (e.g., from a read command), and provides the addresses to each of the column decoder 101 and the row decoder 104. In turn, the row decoder 104 and the column decoder 101 decode the addresses. For example, if the near memory block_0 100b is selected to be accessed, then the address buffer 102 provides one or more control signals. The address buffer 102 provides the addresses of the block to be accessed (i.e., address to be read) to the column decoder 101. A command decoder 103 provides a control signal (pMRS) to a CAS latency control part 106 to provide a CAS latency (CL) value to be applied based on the block(s) to be accessed. The command decoder 103 further provides a read enable signal (REN) according to the read command. In addition to providing the addresses to each of the column decoder 101 and the row decoder 104, the address buffer 102 also provides an MRS_addr (i.e., MRS address of an MRS command) to the CAS latency control part 106. The MRS_addr sets the CAS latency values. The command decoder 103 provides the pMRS signal to the CAS latency control part 106 when the MRS command is input. The address buffer 102 also provides a block address signal to the CAS latency control part 106, while the command decoder 103 provides the REN signal to the CAS latency control part 106, respectively, when the read command is input.

Figure 9A:
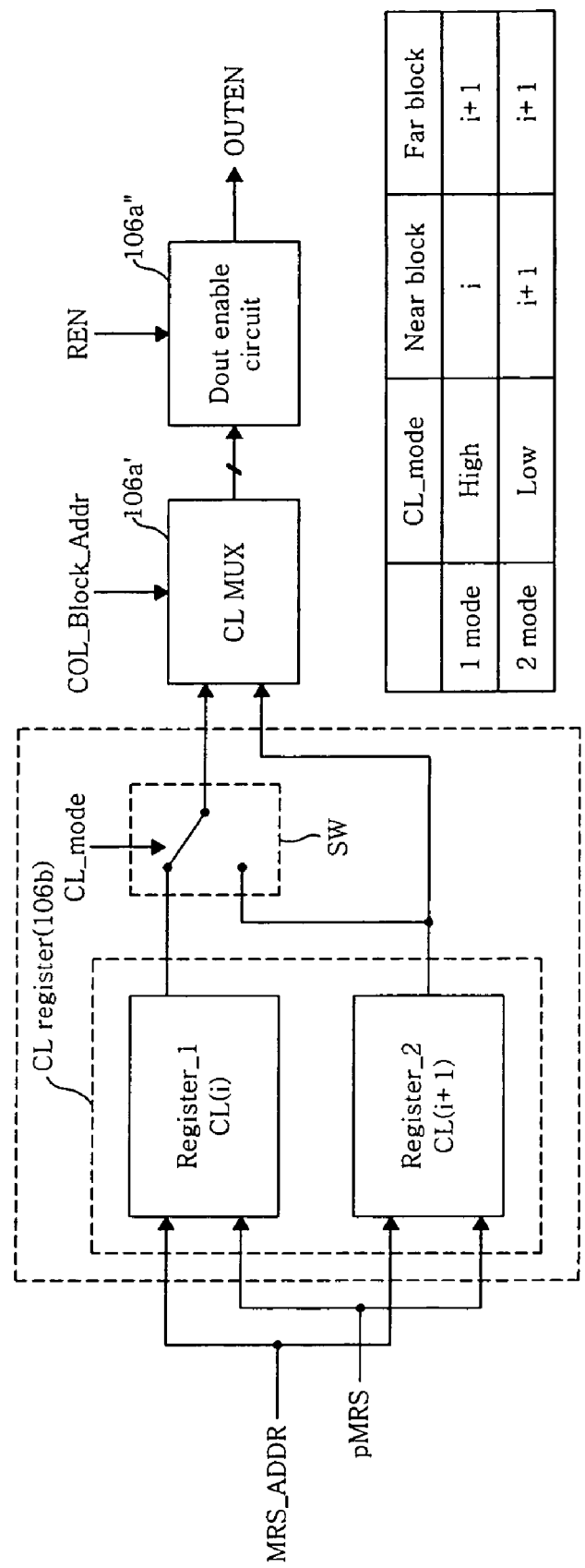
FIG. 9A illustrates a CAS Latency control block diagram of the CAS Latency control part of FIG. 8, according to an embodiment of the present general inventive concept.
Figure 9B:
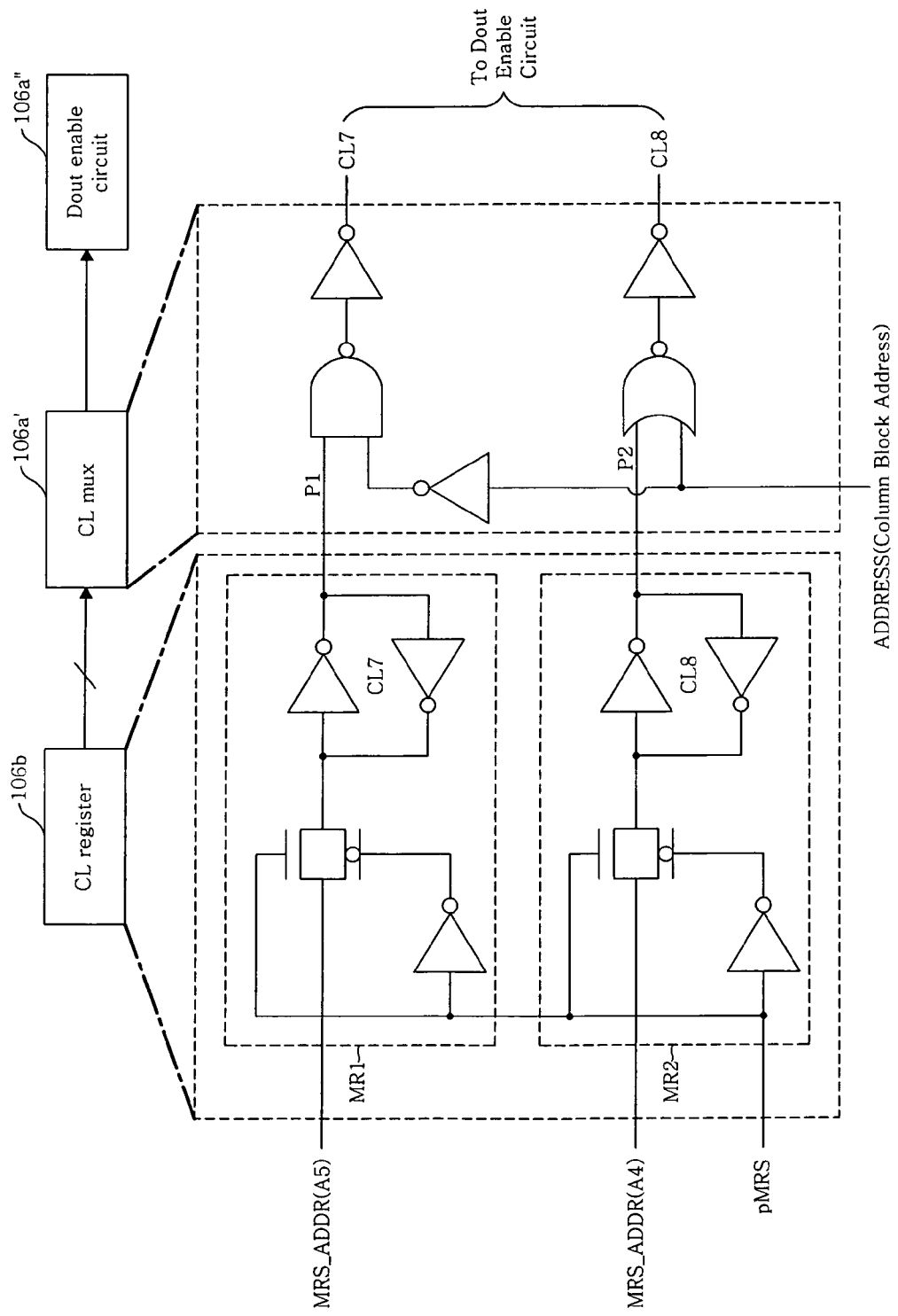
FIG. 9B illustrates a detailed circuit diagram of the CAS Latency Control Part of FIG. 8, according to an embodiment of the present general inventive concept.

The CAS latency control part 106 includes a CL Mux and output enable part 106a and a CL Register part 106b, which are illustrated in greater detail in FIGS. 9A and 9B. The outputs of each of the blocks (block_0 and block_1) are accessed at an output circuit and pad unit 105. For example, the CAS latency control part 106 receives the pMRS signal and the MRS_Addr signal, which sets a CAS latency (CL) mode to be used and a column block address (Col_Block_Addr) to be accessed from the address buffer 102, respectively, to output a CL value to a DOut enable circuit 106a" (see FIG. 9A) according to the column block address to be accessed. The MRS_Addr are bits that are stored in a mode register (i.e., the CL register part 106b in the present embodiment) of the memory device, which are received by the CL register along an address bus, and may include bits (e.g., A4 and A5—see below) that indicate the CL mode to be set.

As illustrated in the embodiment of FIG. 9A, the CL register part 106b can have a register_1 to store a CL(i) value and a register_2 to store a CL(i+1) value. The CL Mux 106a' receives a first CL value from one of the registers between register_1 and register_2 and a second CL value from register_2, and outputs a selected CL value to the Dout enable circuit 106a" in response to the Col_Block Addr (see FIG. 8) received from the address buffer 102. The Dout enable circuit 106a" receives the selected CL value from the CL Mux 106a' and the REN signal (read enable) from the command decoder 103, and outputs an OUTEN (output enable) to data output circuits (e.g., the output circuits and pad unit 105). If a first mode is set, the near memory block 100b has a CL value of CL(i) in clock cycles and the far memory block 100a has a CL value of CL(i+1) in clock cycles. In contrast, if a second mode is set, both the near and far memory blocks 100b and 100a have the same CL value of CL(i+1) in clock cycles. Referring to FIG. 8 and 9A, if the first mode is set and the Col_Block_Addr is a logic low indicating that the near memory block 100b is to be read, then the outputs from the CL register part 106b to the CL Mux 106a' are logic high for CL(i) and logic low for CL(i+1), indicating that the near memory block 100b has the CL value of CL(i) in the first mode. Table 1 below illustrates first and second modes of the CAS Latency control part 106 of FIG. 8 and 9A, by way of example. "A4" and "A5" illustrated in FIG. 9B are bits of the MRS_Addr received along the address bus when the MRS command is input. Exemplary CL values of CL7 (e.g., 7 clock cycles) and CL8 (e.g., 8 clock cycles) are used in Table 1, however, it should be understood that other CL values may also be used with the present general inventive concept.

TABLE 1

|  | MRS_ADDR | | Column block addr (Near Block) | Column block addr (Far Block) |
| --- | --- | --- | --- | --- |
|  | A5 | A4 | CA9 = 0 | CA9 = 1 |
| 1st Mode | 0 | 1 | CL7 = 1, CL8 = 0 | CL7 = 0, CL8 = 1 |
| 2nd Mode | 1 | 0 | CL7 = 0, CL8 = 1 | CL7 = 0, CL8 = 1 |

It is to be noted that the Col_Block_Addr=0 for the near memory block 100b, and the Col_Block_Addr=1 for the far memory block 100a. Further, the 1st mode is set if bits on the address bus are (which carries the MRS_Addr bits) are A5=0 and A4=1 and when the pMRS signal is high according to the MRS command, and the 2nd mode is set if the bits on the address bus are A5=1 and A4=0 and when the pMRS signal is high according to the MRS command. Thus, the switching of the CL mode can be controlled by the MRS_Addr (A4 and A5). If the 1st mode is set and the Col_Block_Addr (CA9) is input as Low (0) with a read command, the near memory block 100b is selected by the address buffer 102 and the CL value of CL7 and the CL value of CL8 are set as high (1) and low (0), respectively. That is, the near memory block 100b operates with the CL value of CL7 (7 clock cycles). These CL values are input to the DOut enable circuit 106a" such that data read from the near memory block 100b is output from the output circuits and pad unit 105 after 7 clock cycles. Accordingly, the CAS latency control part 106 can be used to control the CL value of the near memory block 100b to be less than the CL value (or equal to the CL value when the CL mode is the second mode) of the far memory block 100a. Additionally, it should be noted that although a switch SW is provided in FIG. 9A for illustration purposes only, the switch SW illustrated is not actually interposed between the CL register part 106b (Register_1 and Register_2) and the CL Mux 106a'. The CL mode is actually switched according to the MRS_Addr provided, and the CL value can be selected according to the Col_Block_Addr (on the fly).

As illustrated in FIG. 9B, the CL register part 106b includes individual mode registers (i.e., MR1 and MR2) each having an arrangement of electronic components (e.g., inverters, PMOS and/or NMOS transistors, etc.) to provide an output (P1 and P2) depending on inputs received from the MRS_Addr signal and the pMRS signal. The MRS_Addr signal includes bits that indicate the CL mode, and the pMRS signal enables bits on the address bus (i.e., the MRS_Addr bits) to be stored in the respective mode registers MR1 and MR2 of the CL register part 106b. However, if the far memory block 100a address (CA9=1) is input to the CL Mux 106a' (Col Block Addr signal), the CL value of the far memory block 100a is set to CL8 by setting the CL8 output to "1" regardless of the value of the MRS_Addr signal. In other words, if the far memory block 100a address (e.g., CA9=1) is input to the CL Mux and output enable part 106a, the values of CL8 and CL7 are always set as "1" and "0" respectively, but if the near memory block 100b address (e.g., CA9=0) is input to the CL Mux and output enable part 106a, the values of CL7 and CL8 depend on the Col_Block_Addr signal. The CL Mux 106a' illustrated in FIGS. 8 and 9A-9B may include an arrangement of electrical components including inverters, NAND gate(s) and NOR gate(s) as illustrated. However, the arrangement of electronic components and/or the types of electronic components used in the CL register part 106b and the CL Mux 106a' are not limited to those as illustrated, and may include any type and/or arrangement of electronic components which provide the intended output results of the CAS Latency control part 106 as illustrated in FIGS. 8 and 9A-9B.

A detailed description of the operations of the CL Mux 106a' in FIG. 9B will now be provided. As illustrated in FIG. 9B, a NAND gate of the CL Mux 106a' receives the output (P1) from the mode register MR1 of the CL register part 106b representing a CL7 (CL value of 7) signal (since the CL mode is the first mode), while a NOR gate of the CL Mux 106a' receives the output (P2) from the mode register MR2 of the CL register part 106b representing a CL8 (CL value of 8) signal. The CL Mux 106a' also receives an input "A" that corresponds to the Col_Block_Addr signal that indicates whether the far memory block 100a or the near memory block 100b is to be read. The received input A is applied to each of the NAND gate (in an inverted form) and the NOR gate (in a non-inverted form). The NAND gate and the NOR gate receive bits of the MRS_Addr stored in the mode registers MR1 and MR2 as well as the input A, and determine the appropriate CL value to be output to the DOut enable circuit 106a" between the CL value for the far-side block_1 100a CL(i+1), which is CL8 in this exemplary embodiment (see Table 1), or the CL value for the near-side block_0 100b as one of CL(i) and CL(i+1), which is CL7 or CL8 in this exemplary embodiment (see Table 1). Accordingly, the CL Mux 106a' selects the CL value to be applied according to the address block to be read and outputs the selected CL value to the Dout enable circuit 106a". As described above, in the present embodiment, the CL Mux 106a' outputs CL8 as the CL value anytime the far memory block 100a is selected at the input A, and the CL Mux 106a' outputs either CL7 or CL8 when the near memory block 100b is selected at the input A according to the MRS_Addr (A4 and A5) stored in the mode registers MR1 and MR2. (See FIG. 9B).

The CL mode is set or changed using the MRS_Addr applied to the CL register 106b. For example, the MRS_Addr can be changed by an MRS command input by a user or an executable code. Referring to Table 1 (above) and FIG. 9B, the MRS_Addr values (bits) are applied to the mode registers MR1 and MR2. The pMRS signal may serve as a CL mode change enable signal (CL change enable) that enables the MRS_Addr values stored in the mode registers MR1 and MR2 to be replaced with current MRS_Addr values on the address bus A5 and A4, respectively. Thus, the pMRS signal is activated as high when the MRS command is input. Accordingly, the pMRS signal may be an active high such that when the pMRS is a logic high, the current MRS_Addr values are stored in the respective mode registers MR1 and MR2 and the CL Mode can be changed. For example, the CL mode can be changed between the first mode (in which a "0" is stored in the mode register MR1 and a "1" is stored in the mode register MR2) and the second mode by applying the MRS_Addr values of "1" and "0" on the A5 and A4 bits of the address bus to the mode registers MR1 and MR2, respectively, and applying a logic high to the pMRS signal (CL change enable). The first mode is the CL mode in which the far memory block (i.e., the far-side block_1) 100a and the near memory block (i.e., the near-side block_0) 100b have different CL values. The mode registers MR1 and MR2 continuously output the MRS_Addr values stored between the inverters as the outputs P1 and P2 to the CL Mux 106a'.

According to the present embodiment, the pMRS signal is activated as high when the MRS command is input, and at this time the MRS_addr is input to MR1 and MR2 through the address buffer 102. That is, the CL mode can be changed by the MRS command and a user (or alternative input source) can select either a $1^{st}$ mode or a $2^{nd}$ mode by the MRS command operation. Further, the CL value can be changed according to the column block address input to the CL mux 106a' whenever the read command is input (e.g., the CL value is changed "on-the-fly").

Table 2 below illustrates exemplary MRS_Addr values to be input to the CL register part 106b as well as resulting CL value outputs of the CL register part 106b resulting from the input MRS_Addr. Table 3 below illustrates exemplary values that can be input to the input A of the CL Mux 106a' (FIG. 9B), which corresponds to the Col_Block_Addr, and indicates whether the near memory block 100b is being read in a current read command (i.e., CA9=0) or whether the far memory block 100a is being read in the current read command (i.e., CA9=1). Accordingly, the CL value can be changed "on the fly." That is, the CL value used to read data can change depending on the memory block to be read according to the Col_Block_Addr received at the input A. In other words, the input A of the CL Mux 106a' can be changed at any time to select a different CL value to be used to access the particular block(s). Thus, as opposed to conventional synchronous memory devices in which the CL value for all blocks in the memory device is only set at a power initialization to a CL value that corresponds to a block furthest from an I/O part, the synchronous memory device of the present embodiment can change CL values on the fly during operation thereof according to the Col_Block_Addr of the current read command.

TABLE 2

| MRS_Addr. A5/A4 | CL for near-side |
|---|---|
| 0 1 | CL7 = 1 |
| 1 0 | CL8 = 1 |

TABLE 3

| Column block ADDRESS(CA9) | BLOCK |
|---|---|
| "1" H | FAR |
| "0" L | NEAR |

In accordance with inputs as illustrated in Tables 2 and 3, when the MRS_Addr (A5 and A4) input are applied to the CL register part 106b as a logic input represented respectively as [0 1], the pMRS is high, and CA9 is logic "low", the output from the CL register part 106b for CL7 (CL value of 7 clock cycles) is a logic high output 1 while the output for CL8 (CL value of 8 clock cycles) is a logic low output 0. In other words, the two outputs from the CL register part 106b illustrated in FIG. 9B are logic outputs represented as [1-logic high and 0-logic low].

Referring to FIG. 9B, in the first mode, an inverse of the input A from the Col_Block_Addr is input to the NAND gate along with P1 the logic output high (1) from the CL register part 106b for the CL7. When the near memory block 100b is selected (input A is 0), the NAND gate produces an output of logic low (0) from the inverted input A and the logic high (1) from the CL register part 106b. A first inverter connected to the output of the NAND gate inverts the output of the NAND gate such that the CL7 output is logic high (1). On the other hand, when the far memory block 100b is selected (input A is 1), the NAND gate produces an output of logic high (1) from the inverted input A (which is logic low (0) when the far memory block 100a is selected) and the logic high (1) from the CL register part 106b such that the CL7 output by the first inverter is logic low (0). The NOR gate receives the input A and the logic output low (0) from the CL register 106b for the CL8. When the near memory block 100b is selected (input A is 0), the NOR gate outputs a logic high (1) to a second inverter connected to the output of the NOR gate, which in turn outputs a logic low (0) as the CL8. On the other hand, when the far memory block 100a is selected (input A is 1), the NOR gate outputs a logic low (0) to the second inverter such that the CL8 output is logic high (1). A similar analysis can be applied to FIG. 9B when the memory device is set to the second mode by applying [1 0] to the MRS_Addr signal via the A5 and A4 bits of the address bus. Accordingly, a CAS Latency (CL) of CL7 is applied when accessing the data in the near-side block 100b of FIG. 8 when the MRS_Addr bits A5 and A4 are set to [0 1] to set the CL mode to the first mode. This exemplary output from the CL Mux 106a' [1 0] is then provide to the Dout enable circuit 106a" (see FIGS. 9A and 9B) as the CL value (CL7 in this exemplary embodiment) to provide a CAS Latency required to provide an output enable signal (OUTEN) to the output circuits and pad unit 105 for data to be read from the near-side block_0 (i.e., the near memory block) 100b. In other words, the REN signal input to the Dout enable circuit 106a" is delayed by the CL value provided by the CAS Latency control part 106 before output enabling the data of the near-side block_0 100b. This example represents the first mode (Mode 1) described above. It is to be noted that a CL8 would be applied to the Dout enable circuit 106a" to delay the REN for accessing the far-side block_1 100a. Thus, outputting data of the near memory block_0 100b can be individually determined independent of the data to be read from memory blocks that are a farther distance away from the output circuits and pad unit 105. As can be seen from FIG. 9B, an output of each mode register MR1 and MR2 of the CL Mux and output enable part 106a becomes logic high when the corresponding bits (A5 and A4) of the MRS_Addr are logic low, and vice versa.

Table 4 below illustrates the CL values output from the CL Mux 106a' for each of the near-side block_0 100b and the far-side block_1 100a in the first mode and the second mode, respectively.

TABLE 4

|  | NEAR | FAR |
|---|---|---|
| 1st Mode | 7 | 8 |
| 2nd Mode | 8 | 8 |

Referring to the table 4 above, in the first mode, a CL7 of "1" and a CL8 of "0" are applied to the Dout enable circuit 106a" as a result of the output of the CL register part 106b and the CL Mux 106a' (FIG. 9B) for the near-side block_0 100b, while the CL8 of "1" and the CL7 of "0" is applied to the Dout enable circuit 106a" as a result of the output of the CL register part 106b and the CL Mux 106a' (FIG. 9B) for the far-side block_1. In contrast, in the second mode, a CL8 of "1" and a CL7 of "0" is applied to the Dout enable circuit 106a" as a result of the output of the CL register part 106b and the CL Mux 106a' (FIG. 9B) for both the near-side block_0 100b and for far-side block_1 100a. Thus, according to this embodiment of the present general inventive concept, each block of the memory device can have a separate dedicated programmable latency register, and the CAS latency can be changed at any time depending on the blocks to be read at a given time. In particular, the CL value is input to the Dout enable circuit 106a" when the read command with the Col_Block_Addr is input.

Figure 10:
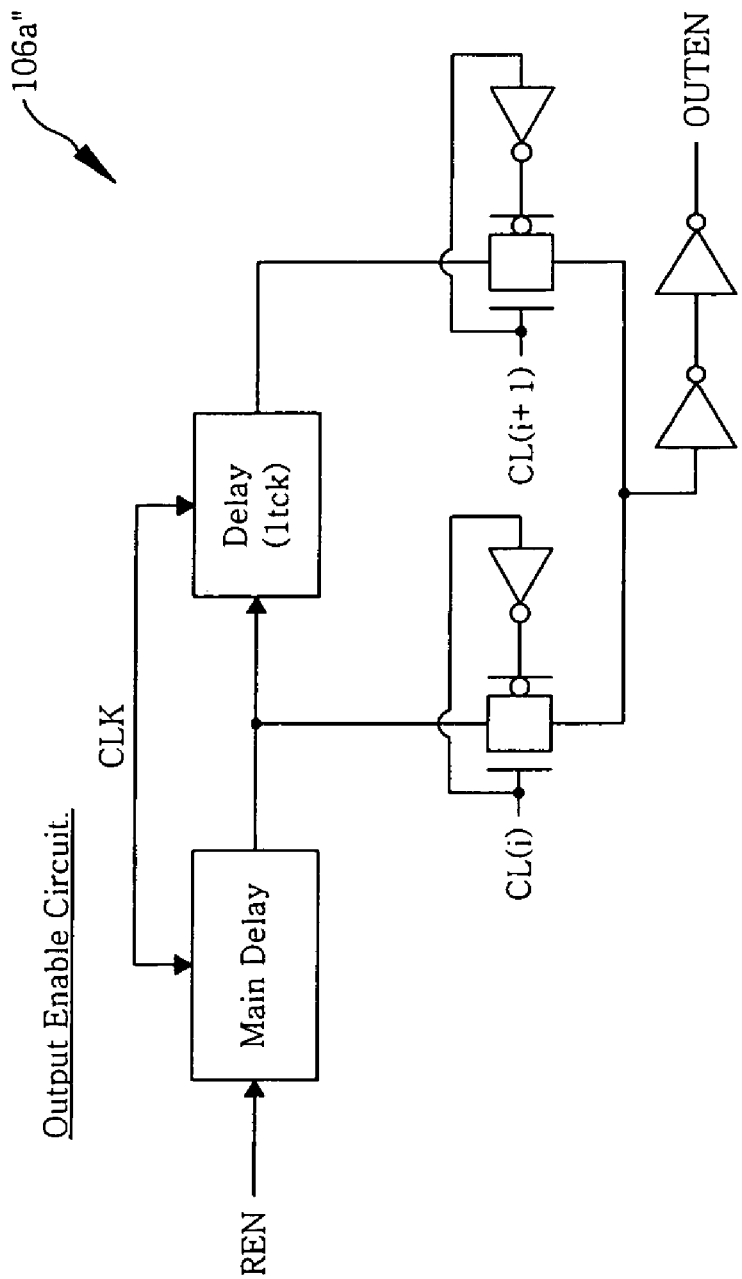
FIG. 10 illustrates a circuit diagram of the Dout enable circuit of FIG. 9B, according to an embodiment of the present general inventive concept.

FIG. 10 illustrates a circuit diagram of the Dout enable circuit 106a" of FIG. 9B, according to an embodiment of the present general inventive concept. The REN signal input to a Main Delay is activated responsive to a read command. The Main Delay delays the REN signal by a number of clocks pre-selected to delay the REN, which in this example is set by CL(i). A Delay (1 tck) delays the already delayed REN (delayed by the Main Delay) by one additional clock cycle, which is therefore delayed by CL(i+1). If CL(i) is selected by the CL Mux 106a' (see FIGS. 9A and 9B), the OUTEN signal is activated after the number of clocks set by CL(i) passes. For example, when the memory device is set to the first mode described above, the Dout enable circuit 106a" of FIG. 10 delays the OUTEN signal using only the Main Delay for accessing the near memory block 100b, and the Main Delay plus the Delay (1 tck) for accessing the far memory block 100a. It is to be noted that the Dout enable circuit 106a" of FIG. 10 can include more delays depending on the number of CL registers to be used, which in turn depends on the number of memory blocks in the memory device in which data is stored.

Similar to the description above with respect to the mode registers (i.e., FIG. 9B) to select CL7 as the CL value to be applied to the output enable circuit 106a" to access enable the near-side memory block_0 100b, another set of mode registers can be used to apply another CL value to access enable the far-side memory block_1 100a. When setting a CL to access enable the far-side memory block_1 100a, CL8 would be selected to provide the appropriate CAS latency (CL value) to the output enable circuit 106a" to access enable data stored in the far-side memory block_1 100a. Thus, the CAS latency control part 106 of FIG. 8 can include separate sets of mode registers to determine a CL value to be applied to access enable data from each memory block, respectively. Alternatively since a separate MRS command can be applied to each set of mode registers to set a CL mode for each respective memory block to be accessed, separate CL values can also be applied for each memory block. Thus, according to an embodiment of the present general inventive concept, separate sets of mode registers within the CAS Latency control part 106 of FIG. 8 (and FIGS. 9A-9B) are provided for each respective memory block to be accessed, this providing a block-dedicated programmable latency register.

Figure 11:
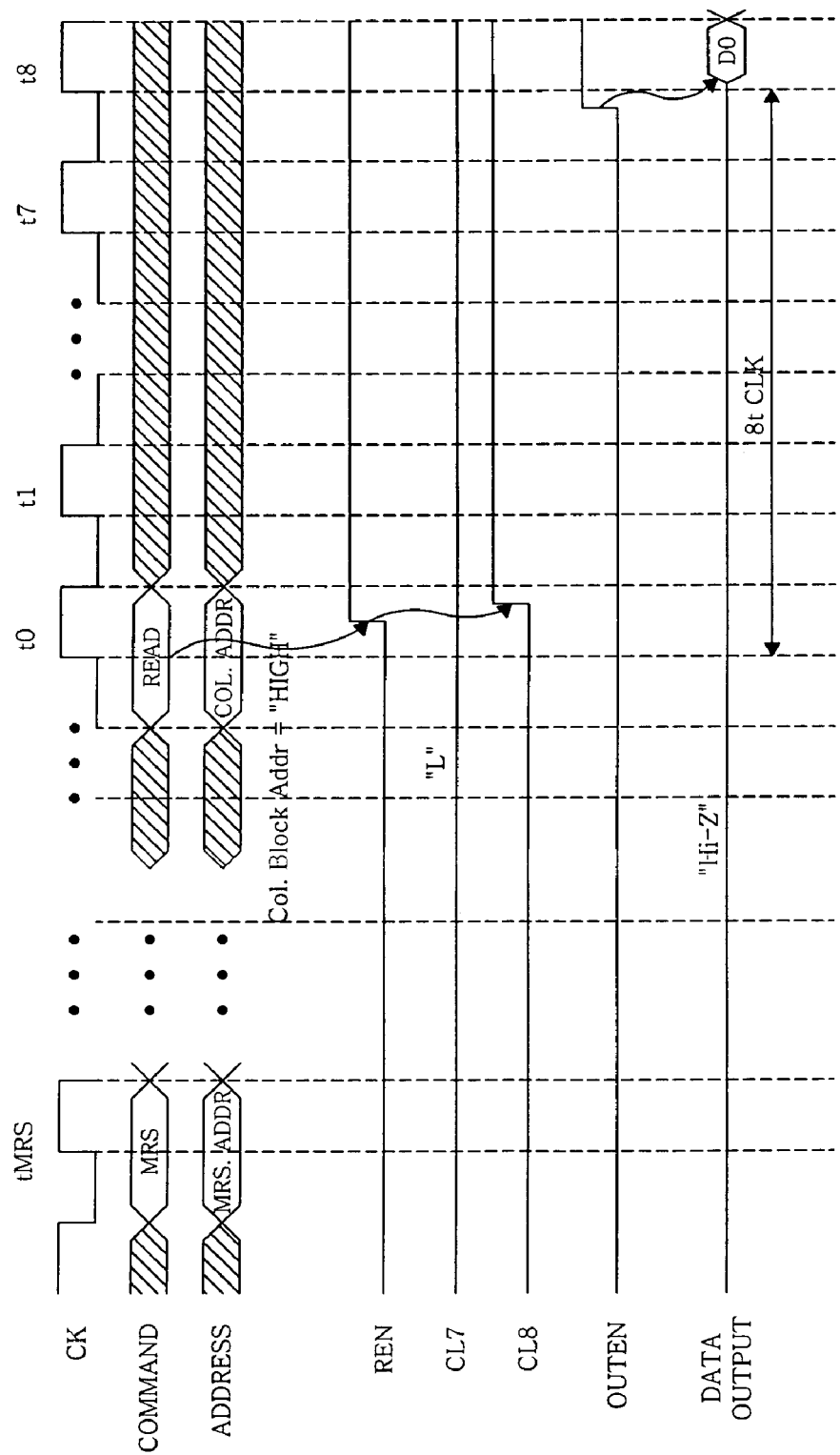
FIG. 11 illustrates a timing chart of operating signals of the CAS Latency control part of FIG. 8, according to an embodiment of the present general inventive concept.

FIG. 11 illustrates a timing chart of operating signals of the CAS Latency control part 106 of FIG. 8, according to an embodiment of the present general inventive concept. The timing chart illustrates operation of the memory device in a case in which either: (1) the first mode or second mode (described supra) are set and the far memory block 100a is selected by the Col_Block_Addr or (2) the second mode is set and the near memory block 100b is selected by the Col_Block_Addr. As illustrated in FIG. 11, a clock CK is provided from a memory controller. The CL values of register 1 and register 2 (see FIGS. 9A and 9B) are set by the MRS command and MRS ADDR signal at a point tMRS of the timing chart (this is the point where the pMRS signal is activated). It is to be noted that the CL values of register 1 and 2 may alternatively be set by fuse cutting instead of the MRS command. The REN signal is activated responsive to a read command. If the column block address (i.e., the Col_Block_Addr) is a logic level high (i.e., the far column block 100a is selected) and the CL mode is set to either one of the first and second modes described above, CL8 is activated as a logic level high and the CL7 remains a logic level low (See table 4) by the operation of the CL mux 106a' (see FIGS. 9A and 9B). Alternatively, if the column block address is a logic level low (i.e., the near column block 100b is selected) and the CL mode is set to the second mode, CL8 is activated as a logic high and the CL7 remains logic level low according to the operation of the CL mux 106a'. Thus, the REN signal is delayed at the Dout enable circuit 106a" such that an OUTEN signal is activated after 7 clock cycles pass. Read data (D0) begins to be output after 8 clock cycles pass.(see DATA OUTPUT, which begins to be accessed (read) following the OUTEN signal, which is delayed until the 8 tCLK). On the other hand, although not shown in FIG. 11, if the column block address is a logic level low such that the near column block 100b is selected and the CL mode is set to the first mode described above, the CL7 would be set to logic level high and the CL8 would instead be set to logic level low. Thus, the REN signal would be delayed at the Dout enable circuit 106a" such that the OUTEN signal is activated after 6 clock cycles pass. The read data (D0) begins to be output after 7 clock cycles pass. (see DATA OUTPUT, which begins to be accessed (read) following the OUTEN signal, which is delayed until the 7tCLK). Accordingly, valid data can be read from the output circuits and pad unit 105 (see FIG. 8).

Figure 12:
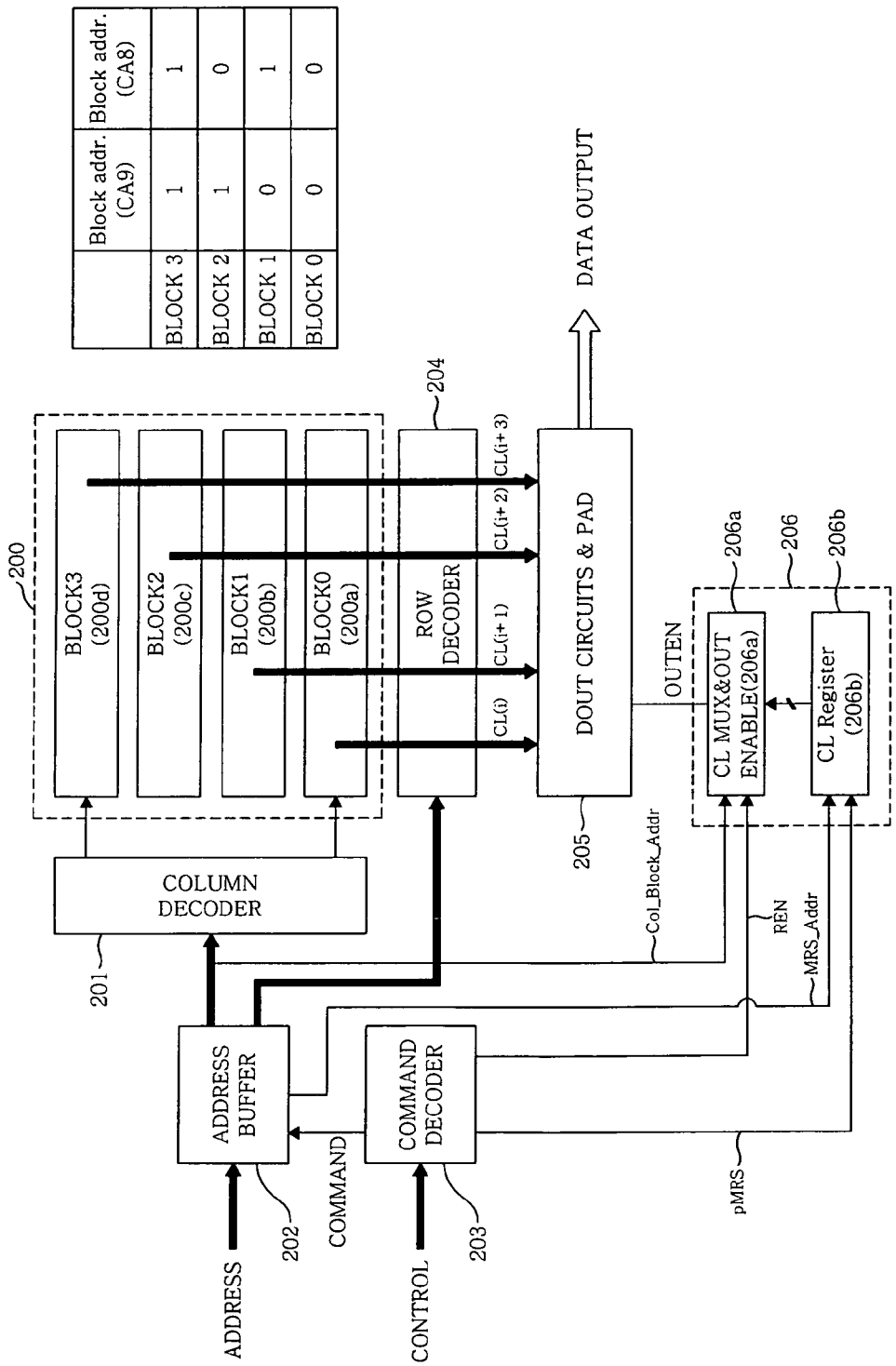
FIG. 12 illustrates a memory device according to another embodiment of the present general inventive concept.

FIG. 12 illustrates a memory device according to another embodiment of the present general inventive concept. In the memory device according to the embodiment of FIG. 12, a memory bank 200 is divided into four memory blocks, including block_0 200a, block_1 200b, block_2 200c, and block_3 200d, each memory block designatable with a different CL value. More specifically, block_0 can be designated with CL(i), block_1 can be designated with CL(i+1), block_2 can be designated CL(i+2), and block_3 can be designated CL(i+3). Similar to the memory device in the embodiment of FIG. 8, the memory device of FIG. 12 includes a column decoder 201 and a row decoder 204 to decode specific portions (e.g., addresses) of the memory blocks_0-3 within the memory bank 200. An address buffer 202 receives a signal designating an address of a block to be accessed, and provides the received signal to each of the column decoder 201, the row decoder 204, and a CAS latency control part 206. For example, if the near memory block_0 200a is requested to be accessed, then the address buffer 202 provides the address of the block to be accessed (read) to the column decoder 201. The address buffer 202 and a command decoder 203 provide MRS_Addr and pMRS signals, respectively, to the CAS latency control part 206 to set a CL mode for the CL(s) to be applied based on the block(s) to be accessed. The CAS latency control part 206 includes a CL Mux and output enable part 206a and a CL Register part 206b. However, unlike the CAS Latency control part 106 of FIG. 8, the CAS Latency control part 206 includes four sets of mode registers (including CL registers), each set of mode registers being designated to one of the memory blocks_0-3. The CAS Latency control part 206 provides an OUTEN signal to a Dout circuit and pad unit 205 based on the CL values selected by the CL Mux 206a', to enable access of data from each of the blocks at a respective CL value. It is clear from FIG. 12 that the distances of each of the blocks (block_0, block_1, block_2 and block_3) from the Dout circuits and pad unit 205 are different (d1<d2<d3<d4). As a result of the respective distances of the memory blocks from the Dout circuits and pad unit 205, a difference in an intrinsic data access time ($\Delta$dt) is greater than an operating clock cycle time $t_{ck}$ ($\Delta$dt>$t_{ck}$). Thus, according to the present embodiment, each memory block is designated with a corresponding CL value in order to increase the performance and operation speed of the memory device. For illustration purposes only, CLs of 7, 8, 9 and 10 will be used in the following discussion for the blocks block_0 200a, block_1 200b, block_2 200c and block_3 200d, respectively, where CL(i)=7, CL(i+1)=8, CL(i+2)=9 and CL(i+3)=10 in clock cycles. In a similar manner as described above, when the MRS command input from a memory controller (not shown) via the command decoder 203, the pMRS signal is activated and the MRS_addr is provided to the CAS latency control part 206 such that the CL mode is set at this time. Thus, when a read command with the block address (i.e., Col_Block_Addr) input from the memory controller via the command decoder 203 and the address buffer 202, the CL value of each block is determined by the block address.

Figure 13A:
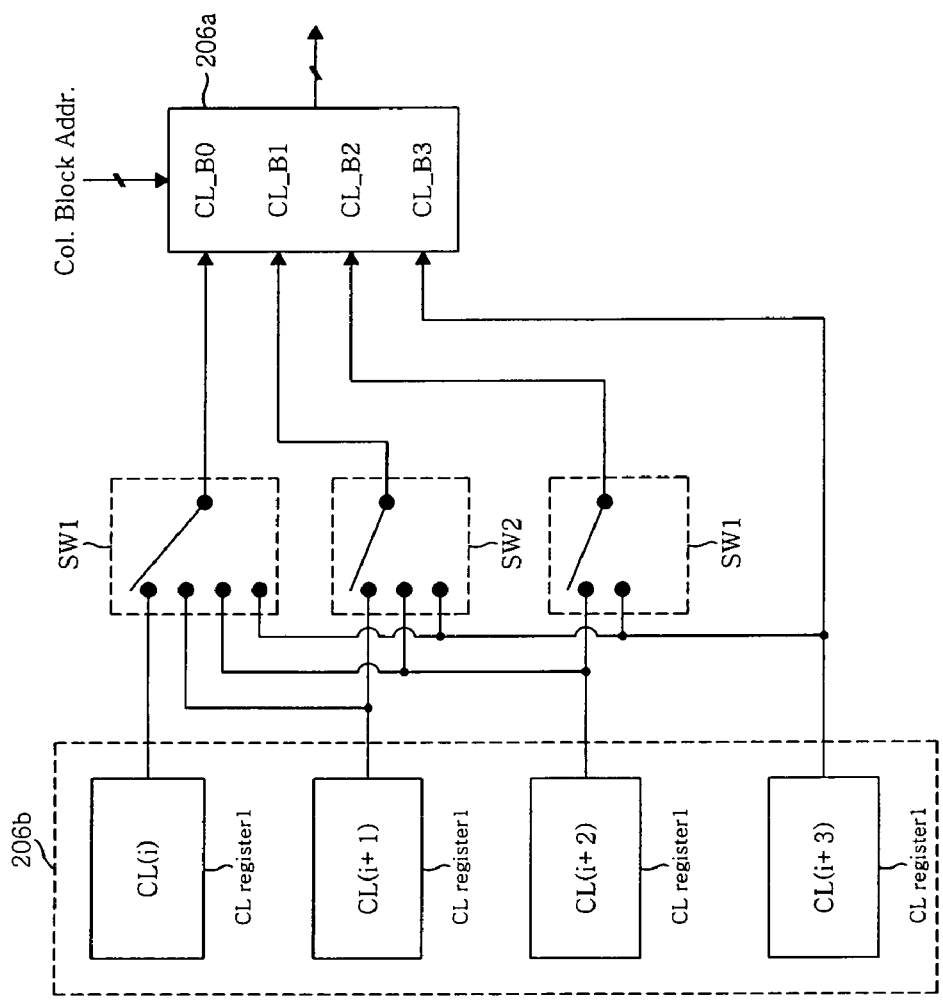
FIG. 13A illustrates a block diagram of a CAS Latency control part of FIG. 12, according to an embodiment of the present general inventive concept.

FIG. 13A illustrates a block diagram of the CAS Latency control part 206 of FIG. 12, according to an embodiment of the present general inventive concept. In FIG. 13A, the CL register part 206b includes four CL registers, each CL register having a different CL value as a result of the MRS command. It is to be noted that the CL values of the CL registers may also be set by fuse cutting instead of the MRS command. The CL Mux 206a' receives a first CL value (either CL(i), CL(i+1), CL(i+2) or CL(i+3)) from one of the CL registers 1-4, a second CL value (either CL(i+1), CL(i+2) or CL(i+3)) from one of the CL registers 2-4, a third CL value (either CL(i+2) or CL(i+3)) from one of the CL registers 3-4, and a fourth CL value CL(i+3) from CL register 4. The CL Mux 206a' outputs a selected CL value to an output enable circuit in FIG. 13B, any one of eight modes can be selected as the CL mode by the MRS_Addr values received along the address bus and the pMRS signal. The CL mode can be changed by MRS command. Thus, each of the memory blocks_0-3 can have a different (or the same) CL value dedicated thereto such that the different CL modes indicate a variety of different combinations of CL values for each of the memory blocks. The CL mode that indicates the CL values for each memory block may be selected based on application speeds. For example, in a low speed application, it may be desirable to use CL values that are the same for all memory blocks (e.g., mode 4). Similarly, in a high speed application, it may be desirable to use different CL values for different memory blocks such that data from the memory blocks that are closer to the output circuit and pad (e.g., block_0) can be read (accessed) at the Dout circuits and pad unit 205 sooner than memory blocks which are farther away and require more time for the data to be accessed. The CL mode may be selected by a user. Additionally, as illustrated in FIG. 13A, the CL registers of the CL register part 206b that correspond to the respective memory blocks each apply their respective CL values to the CL Mux 206a'. It should be noted that switches SW1 and SW2 are illustrated in FIG. 13A for understanding of operations only, and the switches SW1 and SW2 are not actually interposed between the CL registers of the CL register part 206b and the CL Mux 206a'. Conversely, the CL mode is selected according to the MRS_Addr, and the CL value can be switched according to the Col_Block_Addr (on the fly), thus no actual switches are necessary in the embodiment of FIG. 13A. Further, the CL registers 1-4 may actually each include sets of mode registers (as described below with reference to FIG. 14).

Figure 14:
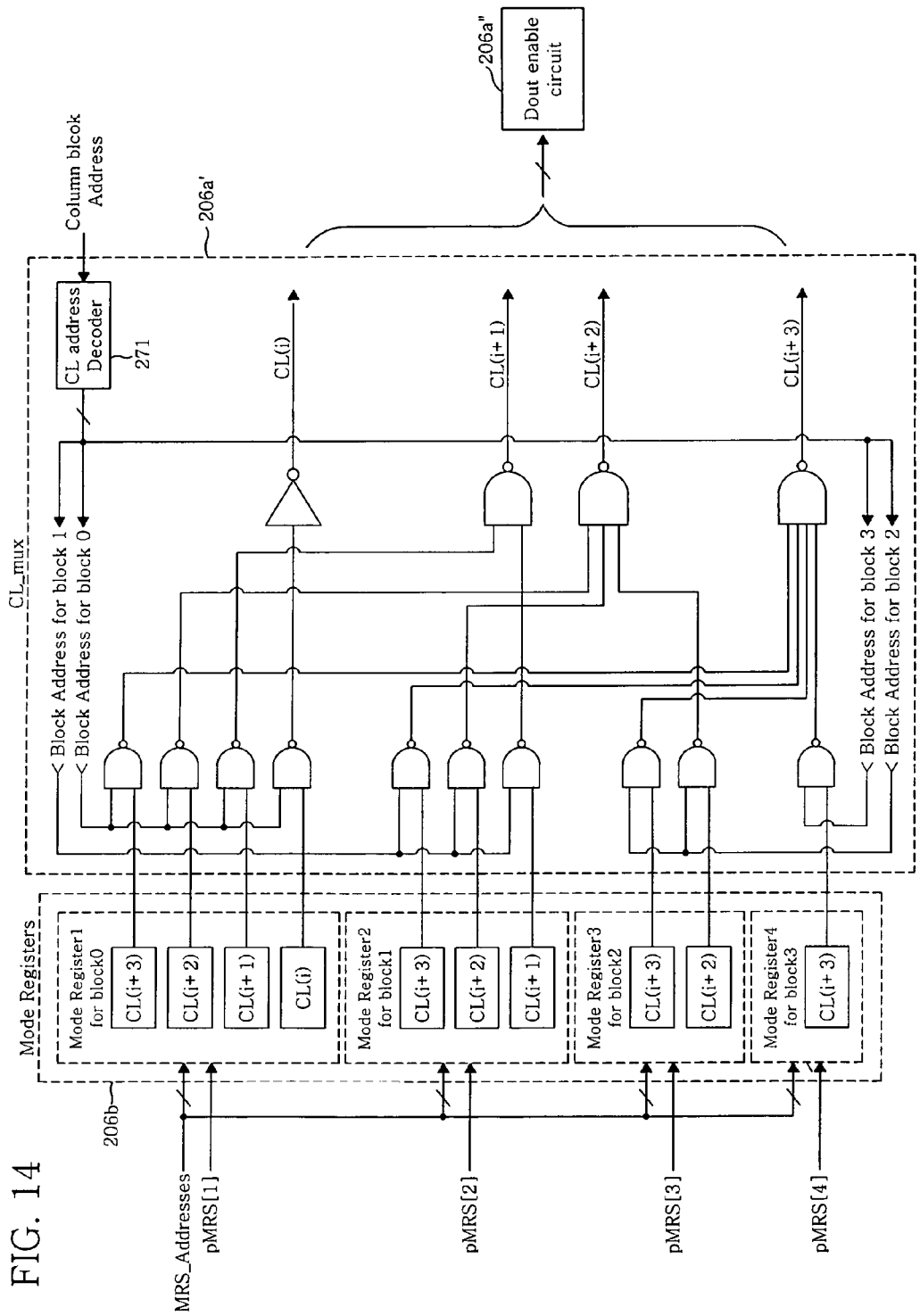
FIG. 14 illustrates an actual detailed circuit diagram of the CAS Latency control part of the embodiment of FIG. 12.

FIG. 14 illustrates an embodiment of an actual detailed circuit diagram of the CAS Latency control part 206 of FIG. 12. As illustrated the embodiment of in FIG. 14, the CL register part 206b includes four sets of mode registers including mode registers, mode register2, mode register3, and mode register4, each of which provides a CL value from the MRS_Addr. Thus, the MRS_Addr input to the sets of mode registers may include multiple values. The first set of mode registers (CL(i+3), CL(i+2), CL(i+1) and CL(i)) is designated to memory block_0, the second set of mode registers (CL(i+3), CL(i+2) and CL(i+1)) is designated to memory block_1, the third set of mode registers (CL(i+3) and CL(i+2)) is designated to memory block_2, and the fourth mode register CL(i+3) is designated to memory block_3. The CL Mux 206a' illustrated in FIG. 12 is illustrated in FIG. 14 as a circuit diagram including a plurality of NAND gates and an inverter. As the outputs of each of the mode registers of the sets of mode registers is output and provided to inputs of the NAND gates as illustrated in FIG. 14, an associated Block Address for a respective memory block is input to the corresponding NAND gates. More specifically, a Block Address signal for memory block_0 is input to the NAND gates that receive the outputs of the set of mode registers for block_0, a Block Address signal for memory block_1 is input to the NAND gates that receive the outputs of the set of mode registers for block_1, a Block Address signal for memory block_2 is input to the NAND gates that receive the outputs of the set of mode registers for block_2, and a Block Address signal for memory block_3 is input to the NAND gate that receives the outputs of the mode register for block_3. The Block Address signals for the memory blocks may be logic high whenever the corresponding memory blocks are selected in the read command. For example, if the read command requests data from block_0, a logic high signal (1) is input to a NAND gate together with each of the outputs of the first set of mode registers (CL(i+3), CL(i+2), CL(i+1) and CL(i)), individually. The logic high signal that corresponds to the selected memory block is provided by a CL address decoder 271 (described below). As a result of the NAND gates and inverter processing the mode register output values and Block Address signals, a signal CL(i+3), CL(i+2), CL(i+1) and CL(i)) is determined according to the MRS_Addr provided to the sets of mode registers and the Block Address signal (i.e., the current Block Address provided by the CL address decoder 271). The current Block Address acts as a selecting signal that selects logic that follows the set of mode registers of the corresponding memory block being accessed.

Operation of the CAS Latency control part 206 will now be described with reference to the circuit diagram of FIG. 14. For description purposes, it will be assumed that the memory device is programmed to operate in mode 1 (i.e., the first mode) as the CL mode (see FIG. 13B) such that block_0 operates with the CL value of CL7 (CL(i)) (7 clock cycles), block_1 operates with the CL value of CL8 (CL(i+1)) (8 clock cycles), block_2 operates with the CL value of CL9 (CL(i+2)) (9 clock cycles), and block_3 operates with the CL value of CL10 (CL(i+3)) (10 clock cycles). The sets of mode registers (mode register1, mode register2, mode register3, and mode register4) that correspond to each of the memory blocks (block_0, block_1, etc.) can be programmed individually using the pMRS signals of each set of mode registers (i.e., pMRS signals pMRS[1], pMRS[2], pMRS[3], and pMRS[4]) as described above with reference to the embodiment of FIGS. 8, 9A, and 9B. Preferably a one time MRS command can activate all pMRS signals. That is, the CL registers of mode register1 for the block_0 may be programmed to set the CL mode to the first mode by applying a logic low (0) of MRS_addr to the CL register CL(i) and a logic high(1) of MRS_addr to the CL registers CL(i+3), CL(i+2) and CL(i+1), where CL(i) corresponds to CL7, CL(i+1) corresponds to CL8, CL(i+2) corresponds to CL9 and CL(i+3) corresponds to CL10.

In this case, the CL value of CL7 is applied by the CL mux 206a' to the output enable circuit whenever the Block Address signal for block_0 indicates that the block_0 is to be accessed. Similarly, the CL registers of mode register2 of the block_1 may be programmed to set the CL mode to the first mode (mode 1) by applying a logic low (0) to the CL register CL(i+1) that corresponds to CL8 and applying a logic high (1) to the CL registers CL(i+3) and CL(i+2) that corresponds to CL9 and CL10 respectively via the address bus while applying a logic high to the pMRS[2] signal. Accordingly, the CL value of CL8 is applied by the CL mux 206a' to the output enable circuit whenever the Block Address signal for block_1 indicates that the block_1 is to be accessed. Further, the CL registers of mode register3 of the block_2 may be programmed to set the CL mode to the first mode (mode 1) by applying a logic low (0) to the CL register CL(i+2) that corresponds to CL9, and applying a logic high (1) to the CL register CL(i+1) that corresponds to CL10 via the address bus while applying a logic high to the pMRS[3] signal. Thus, the CL value of CL9 is applied by the CL mux 206a' to the output enable circuit whenever the Block Address signal of block_2 indicates that the block_2 is to be accessed. Finally, the CL register of mode register4 of the block_3 may be programmed to set the CL mode to the first mode (mode 1) by applying a logic low (0) to the CL register CL(i+3) that corresponds to CL10 via the address bus while applying a logic high to the pMRS[4] signal. Accordingly, the CL value of CL10 is applied by the CL mux 206a' to the output enable circuit whenever the Block Address signal for the block_3 indicates that the block_3 is to be accessed. In other words, when programming each of the sets of mode registers that corresponds to each block, a logic low (0) is applied to the CL register that corresponds to the CL value to be set such that an output of the CL mux 206a' that corresponds to the set CL value is a logic high (1) when the corresponding block is selected according to the column block address. For example, in the first mode (described above), a logic low (0) is applied to the CL register CL(i) in mode register1 for block_0. Accordingly, when the block_0 is selected by the corresponding column block address, the CL(i) output is a logic high (1).

Referring to FIG. 14, the pMRS signals (pMRS[1], pMRS[2], pMRS[3], and pMRS[4]) can be activated by the MRS command, at one time. That is, all the pMRS signals may be the same signal. In this case, MRS_addr (bits A9,A8,A7,A6) are provided to the mode register1 MR1, MRS_addr (bits A6,A5,A4) are provided to the mode register2 MR2, MRS_addr (bits A3,A2) are provided to the mode register3 MR3, and MRS_addr (bit A1) is provided to the mode register4 MR4 while the pMRS signals pMRS[1], pMRS[2], pMRS[3], and pMRS[4]) are logic high.

The programming of the sets of mode registers (i.e., mode register1 through mode register4) of FIG. 14 may be also performed sequentially. The other CL modes indicated in FIG. 14 may be programmed to the sets of mode registers in a similar manner as described above. However, it should be understood that since the CL register CL(i) of mode register4 of the block_3 maintains the CL value of CL10 due to a data access time of the block_3, it is typically unnecessary to reprogram the CL register of mode register4. Furthermore, in the cases in which the CL mode is changed such that the CL value(s) of only one or two sets of mode registers is changed, it is unnecessary to re-program all the sets of mode registers. Therefore, an MRS command may be applied to re-program only the sets of mode registers having a CL value that is to be changed when reading next data. Thus, each of the sets of mode registers may have only one CL register that stores a logic low to indicate the CL value that corresponds to the respective memory block. When the respective memory block is selected through the corresponding Block Address signal, the corresponding CL value is output by the CL Mux 206a' through a series of NAND gates and an inverter so as to provide the corresponding CL value to the output enable circuit. As an example of the operation of the memory device of FIG. 14, when the memory device operates in the first mode (i.e., mode 1) and the block_0 is to be accessed (i.e., the Block Address signal for the block_0 input to the NAND gates of mode register1 is a logic high (1)), the CL register CL(i) in the mode register1 outputs a logic high that is input to a NAND gate together with the other logic high input from the Block Address signal for the block_0. As a result, a logic low will be output by this NAND gate and is then inverted by the inverter such that the CL(i) output is a logic high. Thus, the CL value is CL(i), which is CL7 in the present embodiment.

In another example, when the memory device operates in the first mode and the block_2 is accessed (i.e., the Block Address signal for the block_2 input to the NAND gates of mode register3 is a logic high (1)), the CL register CL(i+2) in the mode register3 outputs a logic high that is input to a NAND gate together with the other logic high input from the Block Address signal for the block_2. Accordingly, a logic low is output by this NAND gate and is then inverted by another NAND such that the CL(i+2) output is a logic high.

If the CL mode is set as the first mode (mode 1), the output of CL(i) of mode register1, the output of CL(i+1) of mode register2, the output of CL(i+2) of mode register3 and the output of CL(i+3) of mode register4 are all logic high "1". Thus, when the read command including the column block addresses is input to the CL address decoder 271 (see FIG. 14), one of the outputs of mode register1~4 is selected to be logic high by the CL mux 206a' and is output to the output enable circuit.

Figure 15A:
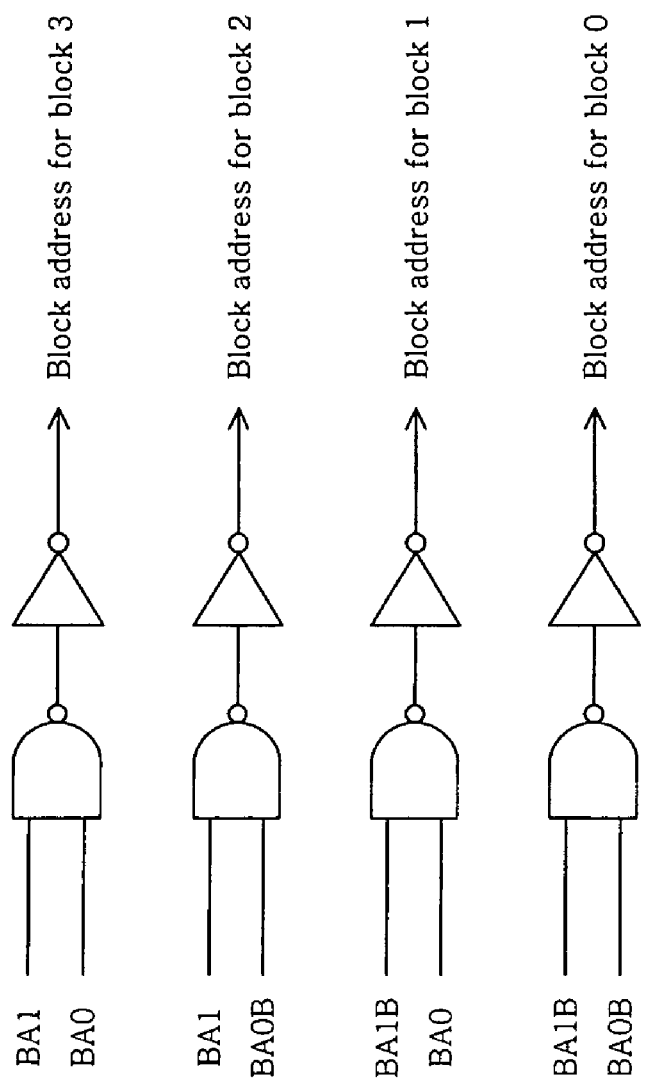
FIG. 15A illustrates a CL address decoder of the CAS Latency control part used to access the respective memory blocks of FIG. 12.

FIG. 15A illustrates the CL address decoder 271 of the CAS Latency control part 206 used to access the respective memory blocks of FIG. 12, and FIG. 15B illustrates a corresponding truth table. In particular, the CL address decoder 271 of FIG. 15A can be used to provide a Block Address signal that is a logic high signal to the NAND gates that correspond to the appropriate set of mode registers in the CAS Latency control part 206 illustrated in FIG. 14. FIG. 15B includes the truth table for the CL address decoder 271. The column block addresses can be represented as two bits BA1 (Block address bit 1) and BA0 (Block address bit 2). As illustrated in FIG. 15B, "00" corresponds to block_0, "01" corresponds to block_1, etc. BA1B and BA0B represent inverses of the block address bits BA1 and BA0, respectively. As can be seen from the CL address decoder 271 and the corresponding truth table, whenever a memory block is selected using the appropriate combination of column block address bits, the CL address decoder 271 produces a logic high signal as the Block Address signal for the respective memory block that is selected. The CL address decoder 271 provides the Block Address signal for the respective memory block to the CL mux 206a' (see FIG. 14).

Figure 16:
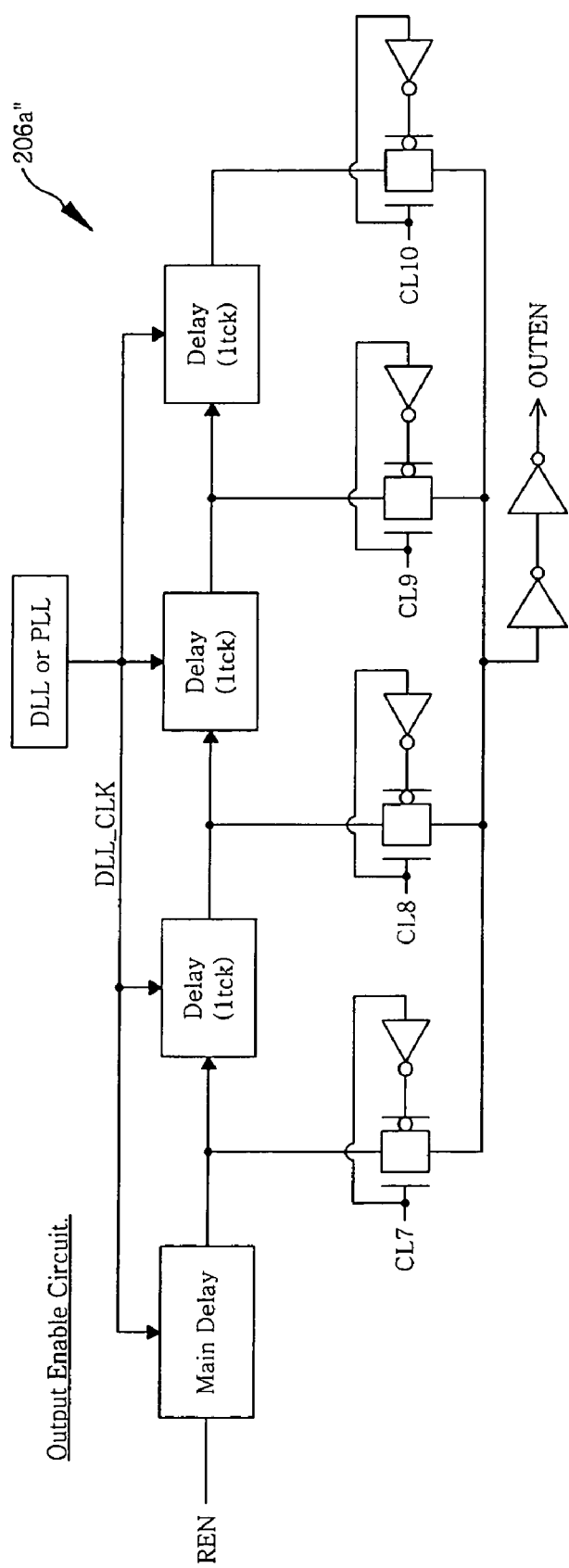
FIG. 16 illustrates a detailed circuit diagram of an output enable circuit of the memory device of FIG. 12.

FIG. 16 illustrates a detailed circuit diagram of an output enable circuit of the memory device of FIG. 12 according to an embodiment of the present general inventive concept. A read enable (REN) signal is responsive to a read command. According to the present embodiment, the output enable circuit includes a main delay circuit and three sub-delay circuits. The main delay circuit delays the REN signal by 7 clock cycles such that the CL value is CL7, the first sub-delay circuit delays the REN signal by an additional clock cycle such that the CL value is CL8, the second sub-delay circuit delays the REN signal by another additional clock cycle such that the CL value is CL9, and the third sub-delay circuit delays the REN by yet another additional clock cycle such that the CL value is CL10. Based on the input from the CL Mux 206a', the output enable circuit delays the REN signal by an appropriate delay to produce a proper OUTEN signal for each respective memory block according to the CL value. The output enable circuit may operate using a delay locked loop (DLL) or a phase locked loop (PLL). Again, it should be noted that these CL values (CL7, CL8, etc.) are exemplary and are not intended to limit the scope of the present general inventive concept.

Figure 17:
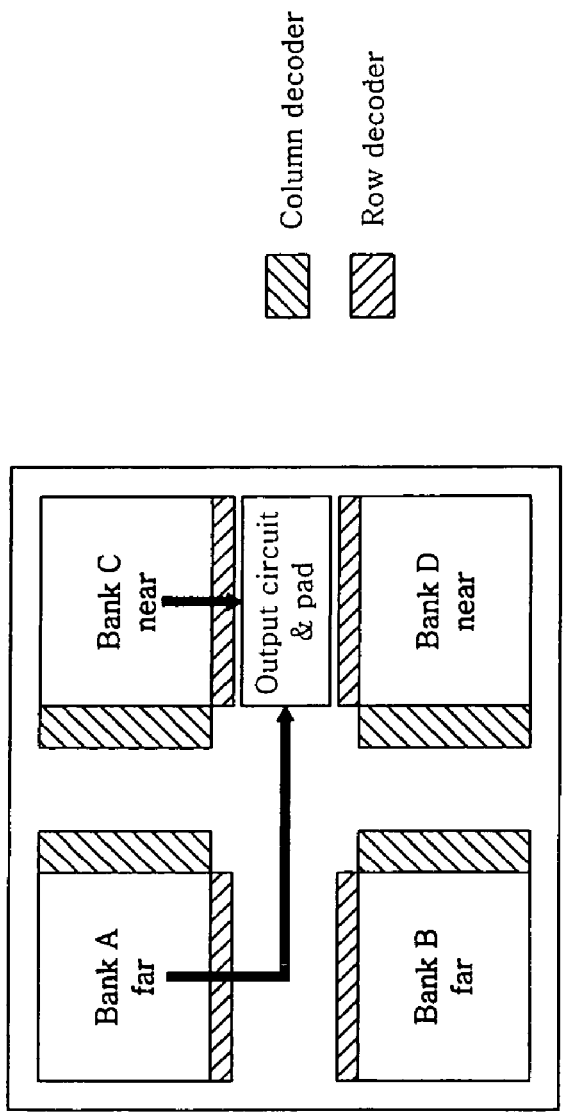
FIG. 17 illustrates where different memory banks of a memory device may have a separate dedicated CL value according to the locations of the memory banks, according to an embodiment of the present general inventive concept.

FIG. 17 illustrates a memory device with four memory banks A, B, C and D according to an embodiment of the present general inventive concept. The present embodiment may function in a similar manner as in the previous embodiments that have been described to access memory blocks. Here, memory banks A and B are represented as far banks with respect to an Output circuits and pad, while the memory banks C and D are represented as near banks with respect to the Output circuits and pad. Here, the A bank and the B bank (far banks) each have a longer data line than that of the C bank and the D bank (near banks). According to an embodiment of the present general inventive concept, if there is a difference in the data line lengths between the memory banks as illustrated, each memory bank can be formed to have a different CL value according to the length of the data line thereof. Thus, the near banks C and D can have a shorter CL value than the CL value of the far banks A and B. In order to compensate for this difference in data line lengths, a CL Mux (not shown) outputs an appropriate CL value to a data output circuit (not shown) responsive to a bank address received with a read command. Thus, in contrast with the previous embodiment where the CL value can be determined based on a memory block address, here the CL value is determined based on the bank address. It should be understood, however, that embodiments of the present general inventive concept may also be applied within each respective bank.

The memory device of FIG. 17 may include a CAS latency control part (not shown) similar to the CAS latency control parts 106 and 206 of the previous embodiments. This CAS latency control part selects the CL value to be applied to the Output circuits and pad for the memory bank accessed with the read command according to a CL mode set by pre-programming the CAS latency control part and the bank address of the read command.

Figure 18A:
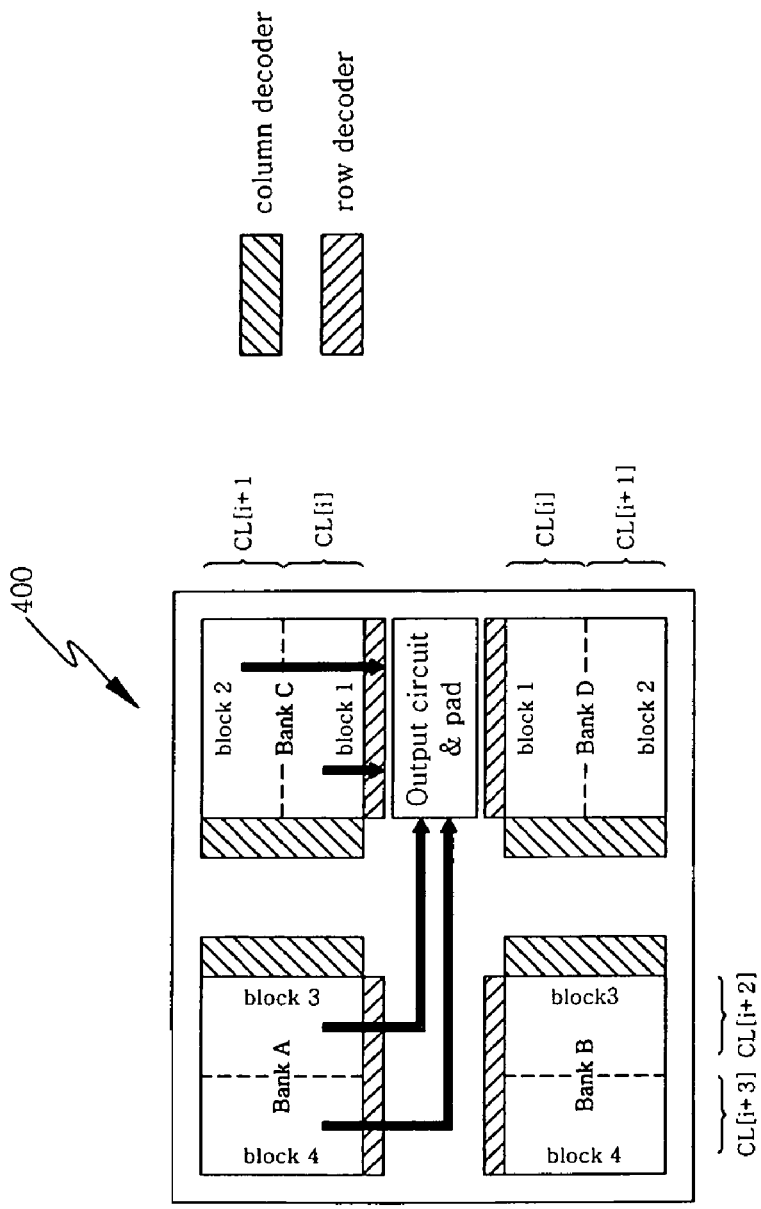
FIG. 18A illustrates another embodiment of the present general inventive concept, where CL values can be dedicated to portions of memory devices in which the memory banks thereof are in different forms such as rows, columns, banks, etc.

FIG. 18A illustrates a memory device 400 according to yet another embodiment of the present general inventive concept, where CL values can be dedicated to portions of memory banks A, B, C, and D when memory arrays thereof are not divided in a simple manner. For example, each of blocks 1, 2, 3, and 4 of the memory device 400 can be divided based on a determined data access time, which may depend on a distance between an Output circuits and pad and each block 1, 2, 3 and 4. Thus, a CL value for the block 1 may be set to CL(i), whereas a CL value of the block 2, which is a farther distance away from the Output circuits and pad, may be designated as CL(i+1), and a CL value of the block 3, which is farther from the Output circuits and pad than either one of blocks 1 and 2, may be designated as CL(i+2), and a CL value of the block 4, which is illustrated as being positioned the farthest from the Output circuits and pad with respect to blocks 1, 2 and 3, may be designated as CL(i+3). Accordingly, bank addresses, column addresses and row addresses can be used to determine which block in which bank is to be accessed, and which CL value to designate to a respective block. The individual banks of FIG. 18A are illustrated as being divided into rows or columns depending on their position with respect to the Output circuits and pad.

A row decoder (R/D) may be located horizontally at the bottom of bank A and the bank C and above the bank B and the bank D such that rows extend in a vertical direction and a row address can divide bank A and bank B into blocks 3 and 4. A column decoder (C/D) may be located vertically at a left side of bank C and/or bank D and at a right side of bank A and/or bank B such that columns extend in a horizontal direction and a column address can divide bank C and bank D into blocks 1 and 2. Each of the banks A, B, C, and D may have its own row decoder and column decoder.

FIG. 18B illustrates a table of logic values that identify the location of addresses for the blocks of the banks of FIG. 18A. "Block" refers to numbered regions in the memory device 400. As illustrated in FIG. 18A, each of the blocks extend between two memory banks. Referring to FIG. 18B, the addresses of the blocks can be represented using a series of bits comprising BA0, BA1, $RA_{MSB}$, and $CA_{MSB}$. In particular, since there are four memory banks A, B, C, and D, two bits (i.e., BA0 and BA1) are necessary to indicate which of the memory banks is being accessed by the read command. $CA_{MSB}$ (column address) divides the memory banks C and D by column into the blocks 1 and 2. More particularly, $CA_{MSB}$ may be the most significant bit of a column address for coding the memory block. Similarly, $RA_{MSB}$ (row address) divides the memory banks A and B by row into the blocks 3 and 4. More particularly, $RA_{MSB}$ may be the most significant bit of a row address for coding the memory block.

FIG. 18B illustrates a truth table that indicates how each of the blocks can be selected when the memory device 400 does not have a simple structure. The X's in FIG. 18B represent "don't care" bits which indicate that an address selection will select a bank or block based on the combination of other bits, regardless of a value of the don't care bit. For example, to select block 3 in bank A, bank address bits BA1 and BA0 are "00" and $RA_{MSB}$ is "0" and since the block 3 or block 4 in bank A is accessed using row addresses, the column address bit($CA_{MSB}$) is a don't care bit "X."

Figure 19:
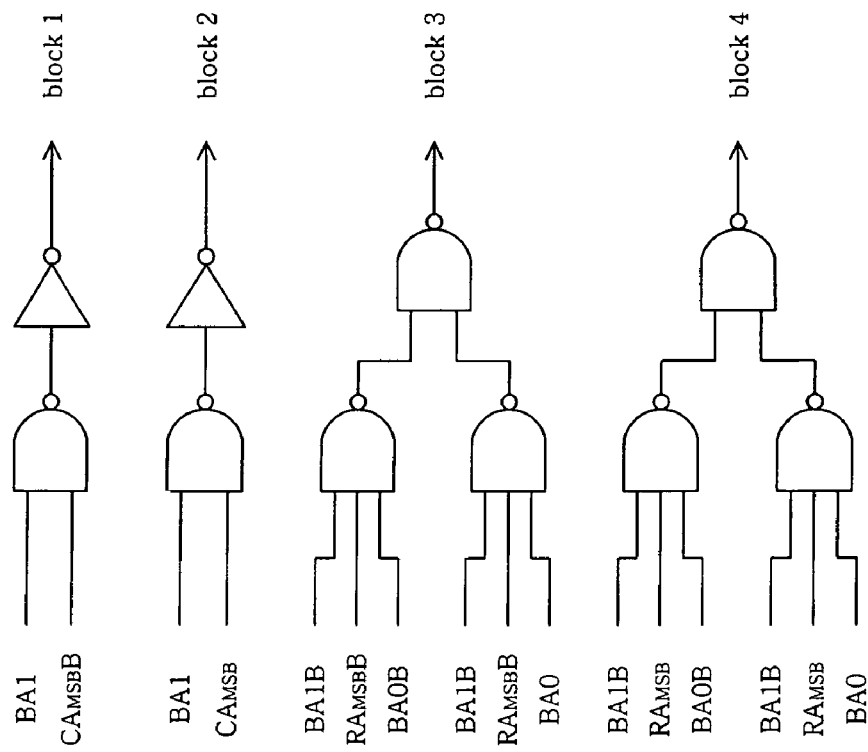
FIG. 19 illustrates a CL address decoder of a CAS Latency control part used to access the memory device of FIG. 18A.

FIG. 19 illustrates a CL address decoder of a CAS Latency control part (not shown) used to access the memory device 400 of FIG. 18A. Since operation of the CL address decoder should be known to one of ordinary skill in the art, a truth table will not be provided here. The CL address decoder of FIG. 19 may operate in a similar manner as the CL address decoder 271 of FIG. 15A. As illustrated in FIG. 19, the CL address decoder receives bank address bits (BA0 and BA1), row address bits ($RA_{MSB}$), and column address bits ($CA_{MSB}$) and their corresponding inverse values. The CL address decoder processes the received bits to produce a logic high signal on the respective memory block that is being selected and provides the logic high signal to a CL Mux (not shown) such that the CL Mux selects an appropriate CL value that corresponds to the selected block.

Figure 20A:
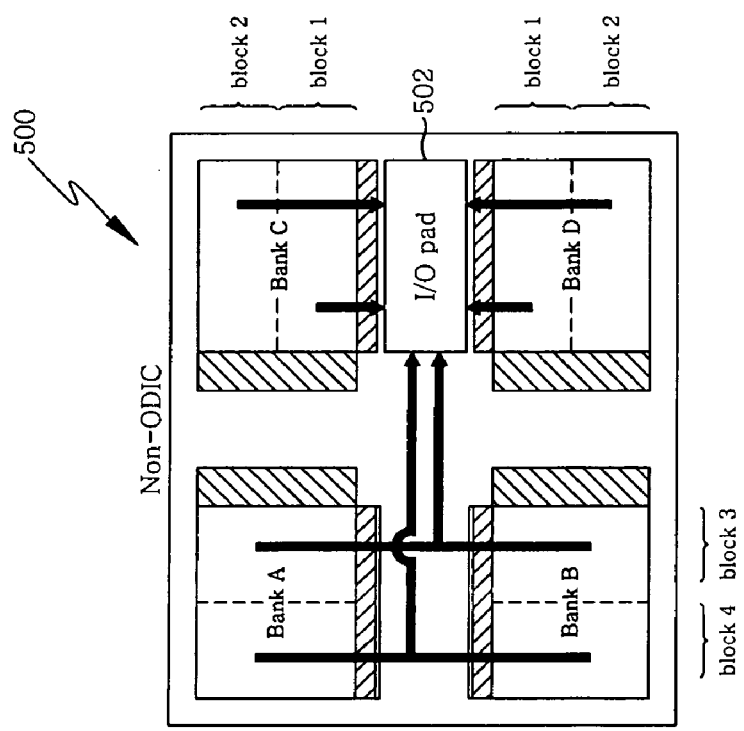
FIG. 20A illustrates a non-ODIC architecture memory device according to an embodiment of the present general inventive concept.
Figure 20B:
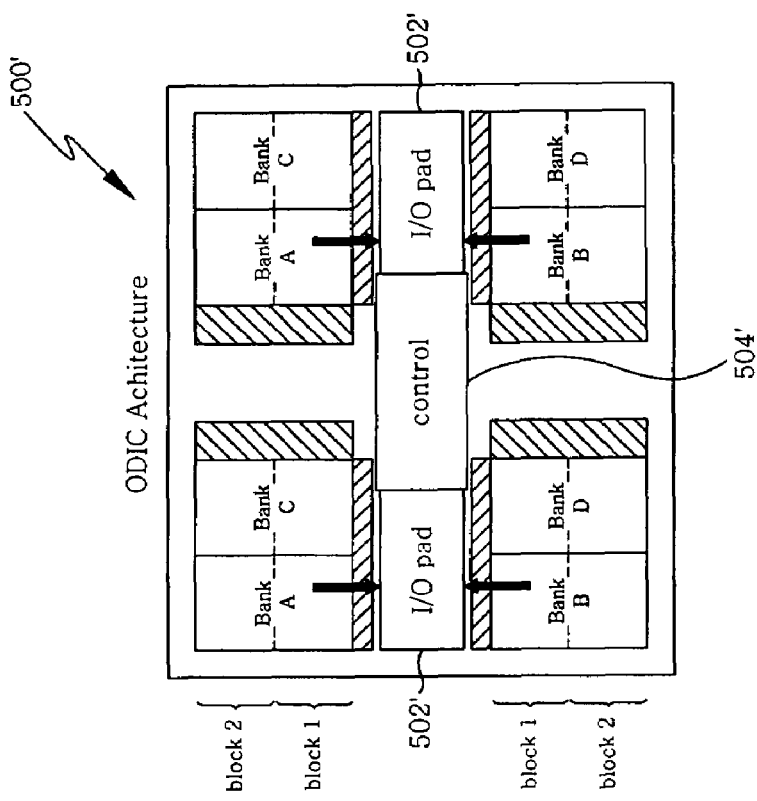
FIG. 20B illustrates an ODIC architecture memory device according to another embodiment of the present general inventive concept

FIGS. 20A and 20B illustrate a memory device 500 (chip) having a non-ODIC (outer DQ inner clock) architecture and a memory device 500' (chip) having an ODIC architecture according to yet other embodiments of the present general inventive concept. In the memory device 500, an I/O pad 502 is located on a right side of the chip between a memory bank C and a memory bank D. In the memory device 500', I/O pads 502' are located on each side of the chip. Accordingly, a number of horizontal data lines extending between the memory banks in the non-ODIC architecture can be reduced in the ODIC architecture memory device 500' such that most, if not all, of the data lines run vertically. As illustrated in FIG. 20B, the present general inventive concept can be embodied in the memory device 500' having the ODIC architecture with left I/O pad 502' and right I/O pad 502' and a control 504'. In particular, each memory bank includes a left and a right portion indicated by letters A/C and B/D. Each bank in the ODIC architecture is divided into 2 portions, for example, a bank A is located on the left and right of the memory device 500'. Read data for each bank may be output from both the left and right portions at the same time. When a read operation for the bank A occurs, half of data that is read from the left portion of bank A can be output to the left I/O pad 502' and the other half of read data from the right portion of bank A can be output to the right I/O pad 502' at the same time. Also each memory bank can be divided into region 1 and region 2 according to the distance from left I/O pad 502' and right I/O pad 502'. Region 1 is closer than region 2 from each I/O pad so that region 1 has a shorter CL value than region 2. Regions 1 and 2 can be divided by column block address or row block address based on where row decoders or column decoders are located in the memory chip 500'. As illustrated FIG. 20B, regions 1 and 2 can be divided by column block address because a column decoder (C/D) is located at the side of each bank. In a similar manner as other embodiments described above, the CL value for region 1(near) and 2(far) can be differentiated by a column block address.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor memory device, comprising:
   at least one memory bank having a plurality of memory blocks to store data, the data stored in the memory blocks capable of being read in response to a read command;
   a control unit to generate a plurality of CL values and to dedicate the CL values to predetermined ones of the memory blocks to be read; and
   an output circuit to output the data in response to a read signal activated by the read command, wherein the output circuit outputs the data from each of the memory blocks based on the dedicated CL values.

2. The semiconductor memory device of claim 1, wherein the control unit comprises:
   a CL register including a plurality of sets of mode registers, each of the sets of mode registers to generate the plurality of CL values; and
   a CL Mux unit to select one of the plurality of CL values from each set of mode registers responsive to a column address within the read command and to dedicate the selected CL values to the predetermined ones of the memory blocks based on predetermined conditions of the memory blocks.

3. The semiconductor memory device of claim 2, wherein the predetermined conditions of the memory blocks includes a location of the memory blocks with respect to the output circuit in which the data is outputted.

4. A latency control unit usable with a memory device having a plurality of memory blocks to store data, comprising:
   a CL register including at least one set of mode registers, each set of mode registers to generate one or more CAS latency values and being dedicated to one of the memory blocks;
   a CL Mux to receive the generated CAS latency values from the at least one set of mode registers and to select one of the received CAS latency values based on a signal containing information on the memory blocks to be read; and
   an output enable circuit to receive the selected CAS latency value and a read enable signal activated by a read command and to output an output enable signal to an output circuit.

5. The latency control unit of claim 4, wherein the output circuit outputs the data stored in accessed memory blocks according to the read command based on the selected CAS latency value and the output enable signal.

6. A latency control unit usable with a memory device having a plurality of memory blocks to store data and a data output circuit to enable output of the stored data from the memory blocks in accordance with a read enable signal, the latency control unit comprising:
   a latency determining unit to determine a plurality of latency values, and to select predetermined ones of the latency values based on an address signal indicating locations of the memory blocks to be read; and
   an output enable unit to receive the latency values output from the latency determining unit and to apply the latency values to the data output circuit to delay output of data from the plurality of memory blocks, wherein the data is output according to predetermined ones of the plurality of latency values based on the location of the memory block in which the data is being output.

7. A memory device comprising:
   at least one memory bank including a plurality of memory blocks;
   an address buffer to receive an address signal, to output MRS addresses to set a CL mode when an MRS command is input, and to output addresses of the address signal when a read command is input;
   an address decoder to decode the addresses and select one of the memory blocks having block addresses;
   a command decoder to receive the MRS command and output a pMRS signal, and to receive the read command and to output a read enable signal; and
   a CAS latency control unit to receive the MRS addresses and the pMRS signal when the MRS command is input so that the CL mode having a plurality of CL values is set, to receive the block addresses to activate one of the plurality of CL values and the read enable signal, and to output an output enable signal to an output circuit according to the activated CL value, wherein the output circuit outputs read data from the selected memory block responsive to the output enable signal.

8. The memory device of claim 7, wherein the CAS latency control unit comprises:
   a CL register including a plurality of mode registers each generating predetermined CL values based on the MRS addresses when the pMRS signal is activated;
   a CL Mux unit to activate one of the CL values from each of the mode registers according to the block addresses; and
   an output enable circuit to receive the read enable signal and the activated CL value, to delay the read enable signal by a number of clocks indicating the activated CL value, and to output the delayed read enable signal as the output enable signal.

9. A memory device comprising:
   an output circuit;
   a plurality of memory blocks that are different distances from the output circuit; and
   a CAS latency control part to operate the output circuit in a plurality of modes including at least a first mode in which the output circuit is operated with a CAS latency value that is the same for accessing the plurality of memory blocks and a second mode in which the output circuit is operated with CAS latency values that are different for accessing the plurality of memory blocks.

10. The memory device of claim 9, wherein the memory device comprises a synchronous dynamic random access memory having an outer DQ inner clock (ODIC) architecture.

11. The memory device of claim 9, wherein the plurality of blocks comprise a plurality of memory banks.

12. The memory device of claim 11, wherein the plurality of blocks further comprise a plurality of regions within the plurality of memory banks.

13. The memory device of claim 9, wherein the CAS latency control part is programmable between the plurality of modes using two or more bits of a mode register set (MRS) command.

14. The memory device of claim 9, wherein the CAS latency control part receives a memory address of one of the plurality of memory blocks to be accessed from a read command, and selects among the different CAS latency values according to the received memory address when the output circuit is operated in the second mode.

15. The memory device of claim 9, wherein the CAS latency control part comprises:
   a plurality of registers corresponding to the plurality of memory blocks to store the respective CAS latency values; and a multiplexer to select from among the plurality of respective CAS latency values according to whether the CAS latency control part operates in the first mode or the second mode.

16. The memory device of claim 15, wherein the multiplexer receives an address of a current memory block being accessed and selects a CAS latency value according to the received address.

17. The memory device of claim 16, wherein the CAS latency control part further comprises:
an output enable circuit to receive the selected CAS latency value and a read enable signal associated with a read command and to delay the read enable signal by a number of clock cycles that corresponds to the selected CAS latency value and to apply an output enable signal that corresponds to the delayed read enable signal to the output circuit.

18. The memory device of claim 16, wherein the received address comprises at least one of a bank address, a column address, and a row address.

19. The memory device of claim 16, wherein the plurality of memory blocks comprise:
four memory banks disposed in each corner of a memory chip on which the memory device is implemented such that the output circuit is disposed on one side of the memory chip in between two memory banks; and
four memory regions arranged among the four memory banks such that each of the four memory regions is a different distance from the output circuit.

20. The memory device of claim 19, wherein each of the memory regions extends over more than one of the memory banks.

21. The memory device of claim 20, wherein first ones of the memory regions extend along a row direction of the memory banks, and second ones of the memory regions extend along a column direction of the memory banks.

22. The memory device of claim 15, wherein:
the plurality of registers comprise a plurality of mode registers that are programmable by a series of bits of an MRS command received along an address bus; and
the multiplexer comprises a plurality of logic units to output a logic high value on an output that corresponds to the selected CAS latency value.

23. The memory device of claim 15, wherein the plurality of registers store the plurality of CAS latency values that corresponds to the plurality of memory blocks.

24. The memory device of claim 9, wherein the plurality of different CAS latency values correspond to different data access times of the plurality of memory blocks.

25. A memory device comprising:
a plurality of memory units; and
a control part to receive a current address associated with a read command, to select a CAS latency value on the fly from among a plurality of CAS latency values associated with the plurality of memory units according to the current address, and to apply the selected CAS latency value to an output circuit of the memory device.

26. The memory device of claim 25, wherein the plurality of memory units comprises:
a far memory unit having a long data access time and a corresponding CAS latency value; and
one or more near memory units having shorter access times and CAS latency values that are programmable to be less than or equal to the CAS latency value of the far memory unit.

27. A method of accessing data from a semiconductor memory device including a plurality of memory blocks, the method comprising:
setting a CL mode having a plurality of CL values to correspond to the plurality of memory blocks when an MRS command is input;
receiving an address to indicate which block is read when a read command is input;
selecting one of the plurality of CL values indicated by the received address;
delaying a read enable signal associated with the read command by a number of clocks designated by the selected CL value and outputting an output enable signal to an output circuit according to the delayed read enable signal; and
outputting data read from the block indicated by the address based on the output enable signal.

28. A method of accessing data from a semiconductor memory device including a plurality of memory banks each having a plurality of memory blocks therein to store data, the method comprising:
dedicating a plurality of CL values to be used by an output circuit that enables data stored in the plurality of memory blocks to be output according to the corresponding plurality of CL values;
receiving an address of a selected memory block to be read associated with a read command;
providing an enable signal that is delayed according to the CL value of the addressed memory block to the output circuit; and
outputting the data read from the addressed memory block according to when the delayed enable signal is received.

29. The method of claim 28, wherein the dedicating of the plurality of CL values to be used by an output circuit comprises dedicating different CL values to memory blocks having different distances from the output circuit.

30. The method of claim 28, wherein the CL values are dedicated to predetermined addresses of the memory blocks such that smaller CL values are applied to memory blocks which are closer to the output circuit and increasingly larger CL values are applied to memory blocks which are positioned increasingly farther away from the output circuit, such that a delay in outputting the data stored in the addressed memory blocks proportionally increases as a distance of the memory block from the output circuit increases.

31. A method of reading data from a memory device having a at least two memory blocks, comprising:
providing an address signal containing information pointing to at least two addresses of the memory device to be read;
selecting at least two CL values that delay for predetermined periods of time outputting of the data to be read from the memory device based on the address signal information; and
enabling output of the data to be read from the at least two addresses of the memory device at different delayed periods of time based on the CL value selected for the corresponding address upon receiving a read enable signal instructing the data to be read from the at least two addresses of the memory device.

32. The method of claim 31, wherein the address signal information includes information about the locations of the addresses of the memory blocks to be read.

33. A method of reading data from a memory device having a I/O pad and a plurality of memory blocks that are different distances from the I/O pad, the method comprising:

applying different CAS latency values to the plurality of memory blocks on the fly when a read command is input.

34. A method of managing data read commands in a memory device, the method comprising:

selecting different column address strobe (CAS) latency values to correspond to memory blocks having different data access times; and delaying a read enable signal associated with each of the memory blocks according to the different CAS latency values when the different memory blocks are accessed.

35. The method of claim 34, wherein the selecting of the different CAS latency values comprises enabling a CAS latency mode having the different CAS latency values for each memory block to be set by an MRS command.

36. The method of claim 34, wherein the delaying of the read enable signal comprises:

receiving a read command having an address to read a specified memory block; and selecting the CAS latency value that corresponds to the specified memory block according to the received address.

37. The method of claim 34, wherein the delaying of the read enable signal comprises:

delaying the read enable associated with a specified memory block by a number of clock cycles of the corresponding CAS latency value; and providing an output enable signal to enable an output circuit having read data from the specified memory block according to the delayed read enable signal associated therewith.

38. The method of claim 34, wherein the selecting of the different CAS latency values comprises selecting a first CAS latency value for a near memory block and selecting a second CAS latency value for a far memory block through an MRS command, and the far memory block is the farthest memory block from an output circuit and the near memory block is closer to the output circuit than the far memory block.

39. The method of claim 38, wherein the selecting of the first CAS latency value comprises:

setting the first CAS latency value to be less than the second CAS latency value in a first mode of operation; and setting the first CAS latency value to be equal to the second CAS latency value in a second mode of operation.

* * * * *